US012222592B2

(12) United States Patent
Dunn et al.

(10) Patent No.: US 12,222,592 B2
(45) Date of Patent: Feb. 11, 2025

(54) SELF-CONTAINED ELECTRONIC DISPLAY ASSEMBLY, MOUNTING STRUCTURE AND METHODS FOR THE SAME

(71) Applicant: Manufacturing Resources International, Inc., Alpharetta, GA (US)

(72) Inventors: William Dunn, Alpharetta, GA (US); Marcos Diaz, Alpharetta, GA (US); Andrew Lincoln, Atlanta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

(21) Appl. No.: 18/750,601

(22) Filed: Jun. 21, 2024

(65) Prior Publication Data

US 2024/0345429 A1 Oct. 17, 2024

Related U.S. Application Data

(63) Continuation of application No. 18/233,525, filed on Aug. 14, 2023, now Pat. No. 12,072,561, which is a (Continued)

(51) Int. Cl.

| | |
|---|---|
| ***G02F 1/1333*** | (2006.01) |
| ***G02F 1/13357*** | (2006.01) |
| ***H05K 7/20*** | (2006.01) |

(52) U.S. Cl.

CPC .. *G02F 1/133308* (2013.01); *G02F 1/133342* (2021.01); *G02F 1/133385* (2013.01); *H05K 7/20972* (2013.01); *G02F 1/133602* (2013.01)

(58) Field of Classification Search

None

See application file for complete search history.

(56) References Cited

U.S. PATENT DOCUMENTS 2,029,221 A 1/1936 Burgess et al.
2,678,860 A 5/1954 Peterson
(Continued)

FOREIGN PATENT DOCUMENTS

AU 2011248190 B2 5/2011
AU 2014287438 B2 1/2018
(Continued)

OTHER PUBLICATIONS

The Free Dictionary, Bolt—Definition of bolt by The Free Dictionary, Jun. 15, 2016, 1 Page.

(Continued)

*Primary Examiner* — Richard H Kim

(74) *Attorney, Agent, or Firm* — Standley Law Group LLP; Jeffrey S. Standley; Adam J. Smith

(57) ABSTRACT

Display assemblies and related systems and methods for mounting are provided. A mounting structure includes a central airflow pathway for a first dedicated flow of ambient air with electronic equipment located along the same. One or more side assemblies are attached to the mounting structure and include a cover, a display layer located rearward of the cover, an illumination device for illuminating at least the display layer when operated, and a side assembly open loop airflow pathway for a second dedicated flow of the ambient air. When operated, the electronic equipment provides functionality other than operation of the one or more side assemblies. The central airflow pathway and the side assembly open loop airflow pathway of each of the one or more side assemblies are fluidly separated from one another.

19 Claims, 22 Drawing Sheets

Related U.S. Application Data continuation-in-part of application No. 17/870,913, filed on Jul. 22, 2022, now Pat. No. 12,010,813.

(56) References Cited

U.S. PATENT DOCUMENTS 3,587,186 A 6/1971 Lane
3,984,931 A 10/1976 Belokin, Jr.
4,093,355 A 6/1978 Kaplit et al.
4,169,327 A 10/1979 Stilling
4,267,657 A 5/1981 Kloke
4,292,370 A 9/1981 Pekko
4,327,513 A 5/1982 de Gunzburg
4,327,803 A 5/1982 Muellejans et al.
4,452,000 A 6/1984 Gandy
4,488,193 A 12/1984 Davis et al.
4,547,987 A 10/1985 Stilling
4,593,978 A 6/1986 Mourey et al.
4,634,225 A 1/1987 Haim et al.
4,748,765 A 6/1988 Martin
4,759,143 A 7/1988 Pomerleau
4,763,993 A 8/1988 Vogeley et al.
4,817,317 A 4/1989 Kovalak, Jr.
4,903,423 A 2/1990 Hinca
4,905,390 A 3/1990 Stilling
4,921,041 A 5/1990 Akachi
4,952,783 A 8/1990 Aufderheide et al.
4,952,925 A 8/1990 Haastert
4,976,536 A 12/1990 Vogeley et al.
5,002,118 A 3/1991 Olmstead et al.
5,025,355 A 6/1991 Harwood
5,029,982 A 7/1991 Nash
5,088,806 A 2/1992 McCartney et al.
5,132,666 A 7/1992 Fahs
5,150,231 A 9/1992 Iwamoto et al.
5,179,367 A 1/1993 Shimizu
5,247,374 A 9/1993 Terada
5,255,029 A 10/1993 Vogeley et al.
5,282,114 A 1/1994 Stone
5,285,677 A 2/1994 Oehler
5,293,930 A 3/1994 Pitasi
5,299,109 A 3/1994 Grondal
5,351,176 A 9/1994 Smith et al.
5,423,142 A 6/1995 Douglas et al.
5,432,526 A 7/1995 Hyatt
5,457,905 A 10/1995 Kaplan
5,493,802 A 2/1996 Simson
5,535,816 A 7/1996 Ishida
D373,120 S 8/1996 Andre et al.
5,559,614 A 9/1996 Urbish et al.
5,621,614 A 4/1997 O'Neill
5,657,641 A 8/1997 Cunningham et al.
5,717,424 A 2/1998 Simson et al.
5,748,269 A 5/1998 Harris et al.
5,755,050 A 5/1998 Aiken
5,765,743 A 6/1998 Sakiura et al.
5,767,489 A 6/1998 Ferrier
5,803,424 A 9/1998 Keehn et al.
5,808,418 A 9/1998 Pitman et al.
5,818,010 A 10/1998 McCann
5,818,694 A 10/1998 Daikoku et al.
5,835,179 A 11/1998 Yamanaka
5,864,465 A 1/1999 Liu
5,869,818 A 2/1999 Kim
5,869,919 A 2/1999 Sato et al.
5,899,027 A 5/1999 St. Louis
5,903,433 A 5/1999 Gudmundsson
5,920,367 A 7/1999 Kajimoto et al.
D415,736 S 10/1999 Witte
5,991,153 A * 11/1999 Heady .................... H05K 7/202
361/679.48
6,003,015 A 12/1999 Kang et al.
6,007,205 A 12/1999 Fujimori
6,043,979 A 3/2000 Shim
6,050,833 A 4/2000 Danzyger et al.
6,089,751 A 7/2000 Conover et al.
6,104,451 A 8/2000 Matsuoka et al.
6,125,565 A 10/2000 Hillstrom
6,157,432 A 12/2000 Helbing
6,172,869 B1 1/2001 Hood, III et al.
6,181,070 B1 1/2001 Dunn et al.
6,191,839 B1 2/2001 Briley et al.
6,198,222 B1 3/2001 Chang
6,204,906 B1 3/2001 Tannas, Jr.
6,211,934 B1 4/2001 Habing et al.
6,215,655 B1 4/2001 Heady et al.
6,231,446 B1 5/2001 Majima et al.
6,244,333 B1 6/2001 Bergh et al.
6,351,381 B1 2/2002 Bilski et al.
6,359,390 B1 3/2002 Nagai
6,380,999 B1 4/2002 Tannas, Jr.
6,392,727 B1 5/2002 Larson et al.
6,405,463 B1 6/2002 Roddy et al.
6,417,900 B1 7/2002 Shin et al.
6,428,198 B1 8/2002 Saccomanno et al.
6,437,673 B1 8/2002 Nishida et al.
6,469,752 B1 10/2002 Ishikawa et al.
6,473,150 B1 10/2002 Takushima et al.
6,476,883 B1 11/2002 Salimes et al.
D467,561 S 12/2002 Kosciolek
6,493,440 B2 12/2002 Gromatsky et al.
6,494,429 B2 12/2002 Tajima
6,496,236 B1 12/2002 Cole et al.
6,504,713 B1 1/2003 Pandolfi et al.
6,535,266 B1 3/2003 Nemeth et al.
6,557,284 B2 5/2003 Nolan
6,628,355 B1 9/2003 Takahara
6,639,571 B2 10/2003 Wang
6,643,130 B1 11/2003 DeMarchis et al.
6,683,639 B2 1/2004 Driessen-Olde Scheper et al.
6,701,143 B1 3/2004 Dukach et al.
6,714,410 B2 3/2004 Wellhofer
6,727,468 B1 4/2004 Nemeth
6,742,583 B2 6/2004 Tikka
6,748,685 B2 6/2004 Peel
6,758,002 B1 7/2004 Duguay
6,800,378 B2 10/2004 Hawa et al.
6,807,051 B2 10/2004 Takahashi
6,812,851 B1 11/2004 Dukach et al.
6,825,828 B2 11/2004 Burke et al.
6,833,992 B2 12/2004 Kusaka et al.
6,839,104 B2 1/2005 Taniguchi et al.
6,850,209 B2 2/2005 Mankins et al.
6,885,412 B2 4/2005 Ohnishi et al.
6,886,942 B2 5/2005 Okada et al.
6,891,135 B2 5/2005 Pala et al.
6,909,486 B2 6/2005 Wang et al.
6,943,768 B2 9/2005 Cavanaugh et al.
6,961,108 B2 11/2005 Wang et al.
6,962,528 B2 11/2005 Yokota
6,976,330 B2 12/2005 Milliken
7,015,470 B2 3/2006 Faytlin et al.
7,059,757 B2 6/2006 Shimizu
7,083,285 B2 8/2006 Hsu et al.
D530,686 S 10/2006 Reza
7,157,838 B2 1/2007 Thielemans et al.
7,161,803 B1 1/2007 Heady
7,164,586 B2 1/2007 Lin
7,170,759 B2 1/2007 Soga
7,190,416 B2 3/2007 Paukshto et al.
7,190,587 B2 3/2007 Kim et al.
7,209,349 B2 4/2007 Chien et al.
7,210,839 B2 5/2007 Jung et al.
7,212,403 B2 5/2007 Rockenfell
D544,848 S 6/2007 Marz et al.
7,226,176 B1 6/2007 Huang
7,259,964 B2 8/2007 Yamamura et al.
7,269,023 B2 9/2007 Nagano
7,284,874 B2 10/2007 Jeong et al.
7,292,435 B2 11/2007 She
7,339,782 B1 3/2008 Landes et al.
7,342,789 B2 3/2008 Hall et al.
7,396,145 B2 7/2008 Wang et al.
7,447,018 B2 11/2008 Lee et al.
7,452,121 B2 11/2008 Cho et al.

(56) References Cited

U.S. PATENT DOCUMENTS 7,457,113 B2 11/2008 Kumhyr et al.
7,458,767 B2 12/2008 Wu et al.
7,466,546 B2 12/2008 Park
7,480,140 B2 1/2009 Hara et al.
7,492,589 B2 2/2009 Park
7,513,830 B2 4/2009 Hajder et al.
7,518,864 B2 4/2009 Kimura
7,525,633 B2 4/2009 Tannas, Jr.
7,529,088 B2 5/2009 Chiu et al.
7,535,543 B2 5/2009 Dewa et al.
7,535,547 B2 5/2009 Tannas, Jr.
D595,678 S 7/2009 Dunn
7,589,958 B2 9/2009 Smith
7,591,508 B2 9/2009 Chang
7,601,067 B2 10/2009 Anderson
7,602,469 B2 10/2009 Shin
7,609,506 B2 10/2009 Aguirre
D608,775 S 1/2010 Leung
7,667,964 B2 2/2010 Kang et al.
7,682,047 B2 3/2010 Hsu et al.
7,708,233 B2 5/2010 Tannas, Jr.
7,752,858 B2 7/2010 Johnson et al.
7,753,567 B2 7/2010 Kang et al.
7,762,707 B2 7/2010 Kim et al.
7,768,775 B2 8/2010 Kim
7,780,492 B2 8/2010 Tannas, Jr.
7,800,706 B2 9/2010 Kim et al.
7,813,124 B2 10/2010 Karppanen
7,864,258 B2 1/2011 Cho et al.
7,868,951 B2 1/2011 Maruta et al.
7,903,416 B2 3/2011 Chou
D635,614 S 4/2011 Yan
7,938,051 B2 5/2011 Tannas
7,965,039 B2 6/2011 Watanabe et al.
7,985,139 B2 7/2011 Lind et al.
7,995,342 B2 8/2011 Nakamichi et al.
8,004,648 B2 8/2011 Dunn
8,006,435 B2 8/2011 DeBlonk et al.
8,016,452 B2 9/2011 Dunn
8,035,968 B2 10/2011 Kwon et al.
8,081,267 B2 12/2011 Moscovitch et al.
8,081,465 B2 12/2011 Nishiura
8,102,173 B2 1/2012 Merrow
8,102,483 B2 1/2012 Perry et al.
8,116,081 B2 2/2012 Crick, Jr.
8,142,027 B2 3/2012 Sakai
D657,421 S 4/2012 Yan
D657,422 S 4/2012 Yan
8,208,115 B2 6/2012 Dunn
8,223,311 B2 7/2012 Kim et al.
8,241,573 B2 8/2012 Banerjee et al.
8,248,784 B2 8/2012 Nakamichi et al.
8,254,121 B2 8/2012 Lee et al.
8,269,916 B2 9/2012 Ohkawa
8,270,163 B2 9/2012 Nakamichi et al.
8,274,622 B2 9/2012 Dunn
8,274,789 B2 9/2012 Nakamichi et al.
D669,938 S 10/2012 Lard et al.
8,300,203 B2 10/2012 Nakamichi et al.
8,310,824 B2 11/2012 Dunn et al.
8,320,119 B2 11/2012 Isoshima et al.
8,335,089 B2 12/2012 Takahashi et al.
8,351,014 B2 1/2013 Dunn
8,358,397 B2 1/2013 Dunn
8,369,083 B2 2/2013 Dunn et al.
8,373,841 B2 2/2013 Dunn
8,379,182 B2 2/2013 Dunn
8,400,608 B2 3/2013 Takahashi et al.
8,418,387 B2 4/2013 Swatt et al.
8,462,497 B2 6/2013 Li et al.
8,472,174 B2 6/2013 Idems et al.
8,472,191 B2 6/2013 Yamamoto et al.
8,482,695 B2 7/2013 Dunn
8,497,972 B2 7/2013 Dunn et al.
8,537,302 B2 9/2013 Dunn
8,590,602 B2 11/2013 Fernandez
8,649,170 B2 2/2014 Dunn et al.
8,649,176 B2 2/2014 Okada et al.
8,654,302 B2 2/2014 Dunn et al.
8,678,603 B2 3/2014 Zhang
8,693,185 B2 4/2014 Dunn et al.
8,700,226 B2 4/2014 Schuch et al.
8,711,321 B2 4/2014 Dunn et al.
D704,265 S 5/2014 Yan
8,749,749 B2 6/2014 Hubbard
8,755,021 B2 6/2014 Hubbard
8,758,144 B2 6/2014 Williams et al.
8,760,613 B2 6/2014 Dunn
8,767,165 B2 7/2014 Dunn
8,773,633 B2 7/2014 Dunn et al.
8,804,091 B2 8/2014 Dunn et al.
8,823,916 B2 9/2014 Hubbard et al.
8,827,472 B2 9/2014 Takada
8,854,572 B2 10/2014 Dunn
8,854,595 B2 10/2014 Dunn
8,879,042 B2 11/2014 Dunn
8,919,778 B2 12/2014 Fodera
8,976,313 B2 3/2015 Kim et al.
8,988,647 B2 3/2015 Hubbard
9,030,641 B2 5/2015 Dunn
9,061,597 B2 6/2015 Oda et al.
9,089,079 B2 7/2015 Dunn
9,119,325 B2 8/2015 Dunn et al.
9,119,330 B2 8/2015 Hubbard et al.
9,173,322 B2 10/2015 Dunn
9,173,325 B2 10/2015 Dunn
9,235,232 B2 1/2016 King
9,282,676 B1 3/2016 Diaz
9,285,108 B2 3/2016 Dunn et al.
9,313,447 B2 4/2016 Dunn et al.
9,313,917 B2 4/2016 Dunn et al.
9,317,060 B2 4/2016 Dunn et al.
9,335,579 B2 5/2016 Onoue
9,338,923 B2 5/2016 Lee et al.
9,357,673 B2 5/2016 Chin
9,370,127 B2 6/2016 Dunn
9,414,516 B2 8/2016 Chin et al.
9,448,569 B2 9/2016 Schuch et al.
9,451,060 B1 9/2016 Bowers et al.
9,451,733 B2 9/2016 Dunn et al.
9,456,525 B2 9/2016 Yoon et al.
9,470,924 B2 10/2016 Dunn et al.
9,500,896 B2 11/2016 Dunn et al.
9,504,188 B1 11/2016 Campbell et al.
9,516,485 B1 12/2016 Bowers et al.
9,549,490 B2 1/2017 Hubbard
9,594,271 B2 3/2017 Dunn et al.
9,600,026 B2 3/2017 Birgeoglu et al.
9,613,548 B2 4/2017 DeMars
9,622,392 B1 4/2017 Bowers et al.
9,629,287 B2 4/2017 Dunn
9,648,790 B2 5/2017 Dunn et al.
9,655,289 B2 5/2017 Dunn et al.
9,703,230 B2 7/2017 Bowers et al.
9,703,320 B2 7/2017 Bowers et al.
9,723,765 B2 8/2017 DeMars
9,743,553 B2 8/2017 Kim et al.
9,756,739 B2 9/2017 Russell-Clarke et al.
9,797,588 B2 10/2017 Dunn et al.
9,801,305 B2 10/2017 Dunn et al.
9,823,690 B2 11/2017 Bowers et al.
9,835,893 B2 12/2017 Dunn
9,857,618 B2 1/2018 Barnes
9,861,007 B2 1/2018 Yoon et al.
9,894,800 B2 2/2018 Dunn
10,070,540 B2 9/2018 Campagna et al.
10,080,316 B2 9/2018 Dunn et al.
10,088,702 B2 10/2018 Dunn et al.
10,143,106 B2 11/2018 Diaz
10,165,712 B1 12/2018 Jang et al.
10,180,591 B2 1/2019 Lee et al.
10,194,564 B2 1/2019 Dunn et al.
10,212,845 B2 2/2019 Dunn et al.
10,278,311 B2 4/2019 DeMars

(56) References Cited

U.S. PATENT DOCUMENTS 10,278,312 B1 4/2019 Davis et al.
10,306,781 B2 5/2019 Cho et al.
10,314,212 B2 6/2019 Hubbard
10,359,659 B2 7/2019 Dunn et al.
10,359,817 B2 7/2019 Yun et al.
10,383,238 B2 8/2019 Yun et al.
10,398,058 B2 8/2019 Diaz
10,398,066 B2 8/2019 Dunn et al.
10,401,016 B2 9/2019 Coo
10,405,456 B2 9/2019 Jang et al.
10,409,323 B2 9/2019 Birgeoglu et al.
10,420,257 B2 9/2019 Dunn et al.
10,485,113 B2 11/2019 Dunn et al.
10,485,147 B2 11/2019 Oh et al.
10,485,148 B2 11/2019 Oh et al.
10,488,896 B2 11/2019 Simpson
10,499,516 B2 12/2019 Dunn et al.
10,506,738 B2 12/2019 Dunn
10,506,740 B2 12/2019 Dunn et al.
10,524,384 B2 12/2019 Dunn et al.
10,524,397 B2 12/2019 Dunn et al.
10,548,247 B2 1/2020 Demars
10,559,965 B2 2/2020 Dunn et al.
10,602,626 B2 3/2020 Dunn
10,624,218 B2 4/2020 Dunn et al.
10,660,245 B2 5/2020 Dunn et al.
10,687,446 B2 6/2020 Dunn et al.
10,716,224 B2 7/2020 Dunn et al.
10,721,836 B2 7/2020 Dunn et al.
10,736,245 B2 8/2020 Dunn et al.
10,747,261 B2 8/2020 Birgeoglu et al.
10,754,184 B2 8/2020 Wang et al.
10,757,844 B2 8/2020 Dunn et al.
10,795,413 B1 10/2020 Dunn
10,820,445 B2 10/2020 Diaz
10,827,644 B2 11/2020 Diaz
10,827,656 B2 11/2020 Hubbard
10,827,657 B2 11/2020 Lee
10,844,995 B1 11/2020 Wang et al.
10,905,035 B2 1/2021 Whitehead et al.
10,925,174 B2 2/2021 Dunn et al.
10,969,615 B2 4/2021 Wang et al.
10,973,156 B2 4/2021 Dunn et al.
10,983,382 B2 4/2021 Takase
10,999,941 B2 5/2021 Dunn
11,013,142 B2 5/2021 Dunn et al.
11,016,547 B2 5/2021 Whitehead et al.
11,019,735 B2 5/2021 Dunn
11,032,923 B2 6/2021 Dunn et al.
11,096,317 B2 8/2021 Dunn
11,117,482 B2 9/2021 Mercer et al.
11,191,193 B2 11/2021 Hubbard
11,206,750 B2 12/2021 Lee et al.
11,336,101 B2 5/2022 Hao et al.
11,470,749 B2 10/2022 Dunn et al.
11,477,923 B2 10/2022 Brown
11,507,141 B2 11/2022 Dunn
11,540,418 B2 12/2022 Dunn et al.
11,596,081 B2 2/2023 Dunn et al.
11,617,287 B2 3/2023 Dunn
11,744,036 B2 8/2023 Diaz
11,744,054 B2 8/2023 Dunn et al.
11,762,231 B2 9/2023 Dunn et al.
11,822,171 B2 11/2023 Dunn et al.
11,889,636 B2 1/2024 Dunn
11,919,393 B2 3/2024 Dunn et al.
11,934,054 B2 3/2024 Dunn et al.
11,966,263 B2 4/2024 Dunn et al.
11,968,813 B2 4/2024 Dunn et al.
11,989,059 B2 5/2024 Dunn
12,004,310 B2 6/2024 Dunn et al.
12,004,311 B2 6/2024 Dunn
12,010,813 B2 6/2024 Dunn et al.
12,010,824 B2 6/2024 Dunn
2001/0001459 A1 5/2001 Savant et al.
2001/0019454 A1 9/2001 Tadic-Galeb et al.
2001/0023914 A1 9/2001 Oddsen, Jr.
2001/0032404 A1 10/2001 Hillstrom
2001/0043290 A1 11/2001 Yamamoto
2001/0043293 A1 11/2001 Inoue
2002/0009978 A1 1/2002 Dukach et al.
2002/0033919 A1 3/2002 Sanelle et al.
2002/0050793 A1 5/2002 Cull et al.
2002/0065046 A1 5/2002 Mankins et al.
2002/0084891 A1 7/2002 Mankins et al.
2002/0101553 A1 8/2002 Enomoto et al.
2002/0112026 A1 8/2002 Fridman et al.
2002/0122134 A1 9/2002 Kalua
2002/0126248 A1 9/2002 Yoshida
2002/0135741 A1 9/2002 Lee et al.
2002/0148600 A1 10/2002 Bosch et al.
2002/0149714 A1 10/2002 Anderson et al.
2002/0154255 A1 10/2002 Gromatzky et al.
2002/0164944 A1 11/2002 Haglid
2002/0164962 A1 11/2002 Mankins et al.
2002/0167637 A1 11/2002 Burke et al.
2003/0007109 A1 1/2003 Park
2003/0020679 A1 1/2003 Kojima et al.
2003/0020884 A1 1/2003 Okada et al.
2003/0039094 A1 2/2003 Sarkinen et al.
2003/0043091 A1 3/2003 Takeuchi et al.
2003/0104210 A1 6/2003 Azumi et al.
2003/0128511 A1 7/2003 Nagashima et al.
2003/0214785 A1 11/2003 Perazzo
2004/0012722 A1 1/2004 Alvarez
2004/0025389 A1 2/2004 Peterson
2004/0035032 A1 2/2004 Milliken
2004/0035558 A1 2/2004 Todd et al.
2004/0036622 A1 2/2004 Dukach et al.
2004/0036834 A1 2/2004 Ohnishi et al.
2004/0042174 A1 3/2004 Tomioka et al.
2004/0103570 A1 6/2004 Ruttenberg
2004/0105159 A1 6/2004 Saccomanno et al.
2004/0135482 A1 7/2004 Thielemans et al.
2004/0165139 A1 8/2004 Anderson et al.
2004/0207981 A1 10/2004 Gorenz, Jr. et al.
2004/0212548 A1 10/2004 Ruttenberg
2004/0223299 A1 11/2004 Ghosh
2004/0257492 A1 12/2004 Mai et al.
2005/0012039 A1 1/2005 Faytlin et al.
2005/0012722 A1 1/2005 Chon
2005/0062373 A1 3/2005 Kim et al.
2005/0073632 A1 4/2005 Dunn et al.
2005/0073639 A1 4/2005 Pan
2005/0094039 A1 5/2005 Kim et al.
2005/0105178 A1 5/2005 Kim
2005/0127796 A1 6/2005 Olesen et al.
2005/0134525 A1 6/2005 Tanghe et al.
2005/0134526 A1 6/2005 Willem et al.
2005/0213950 A1 9/2005 Yoshimura
2005/0219841 A1 10/2005 Ikeda et al.
2005/0229630 A1 10/2005 Richter et al.
2005/0237714 A1 10/2005 Ebermann
2005/0253699 A1 11/2005 Madonia
2005/0276053 A1 12/2005 Nortrup et al.
2005/0286131 A1 12/2005 Saxena et al.
2006/0012958 A1 1/2006 Tomioka et al.
2006/0012985 A1 1/2006 Archie, Jr. et al.
2006/0018093 A1 1/2006 Lai et al.
2006/0034051 A1 2/2006 Wang et al.
2006/0056994 A1 3/2006 Van Lear et al.
2006/0060732 A1 3/2006 Tannas, Jr.
2006/0077636 A1 4/2006 Kim
2006/0081366 A1 4/2006 Chiu et al.
2006/0081367 A1 4/2006 Chiu et al.
2006/0082271 A1 4/2006 Lee et al.
2006/0092348 A1 5/2006 Park
2006/0125998 A1 6/2006 Dewa et al.
2006/0132699 A1 6/2006 Cho et al.
2006/0133090 A1 6/2006 Noh et al.
2006/0137294 A1 6/2006 Waits et al.
2006/0177587 A1 8/2006 Ishizuka et al.
2006/0199514 A1 9/2006 Kimura
2006/0209266 A1 9/2006 Utsunomiya

(56) References Cited

U.S. PATENT DOCUMENTS

2006/0215421 A1 9/2006 Chang et al.
2006/0218828 A1 10/2006 Schrimpf et al.
2006/0221270 A1 10/2006 Ioki et al.
2006/0260790 A1 11/2006 Theno et al.
2006/0262079 A1 11/2006 Seong et al.
2006/0266499 A1 11/2006 Choi et al.
2006/0266900 A1 11/2006 May et al.
2006/0268194 A1 11/2006 Morimoto et al.
2006/0269216 A1 11/2006 Wiemeyer et al.
2006/0283579 A1 12/2006 Ghosh et al.
2007/0013647 A1 1/2007 Lee et al.
2007/0019419 A1 1/2007 Hafuka et al.
2007/0021217 A1 1/2007 Wu
2007/0030879 A1 2/2007 Hatta
2007/0046874 A1 3/2007 Adachi et al.
2007/0047239 A1 3/2007 Kang et al.
2007/0065091 A1 3/2007 Hinata et al.
2007/0070615 A1 3/2007 Joslin et al.
2007/0076431 A1 4/2007 Atarashi et al.
2007/0081344 A1 4/2007 Cappaert et al.
2007/0103863 A1 5/2007 Kim
2007/0103866 A1 5/2007 Park
2007/0115686 A1 5/2007 Tyberghien
2007/0126335 A1 6/2007 You et al.
2007/0139574 A1 6/2007 Ko et al.
2007/0139929 A1 6/2007 Yoo et al.
2007/0140671 A1 6/2007 Yoshimura
2007/0144704 A1 6/2007 Bundza et al.
2007/0151164 A1 7/2007 Marshall
2007/0151274 A1 7/2007 Roche et al.
2007/0151664 A1 7/2007 Shin
2007/0171353 A1 7/2007 Hong
2007/0176885 A1 8/2007 Jun
2007/0206158 A1 9/2007 Kinoshita et al.
2007/0211205 A1 9/2007 Shibata
2007/0212211 A1 9/2007 Chiyoda et al.
2007/0217221 A1 9/2007 Lee et al.
2007/0237636 A1 10/2007 Hsu
2007/0253205 A1 11/2007 Welker
2007/0267174 A1 11/2007 Kim
2007/0267554 A1 11/2007 Tannas, Jr.
2007/0274051 A1 11/2007 Horng et al.
2008/0002350 A1 1/2008 Farrugia
2008/0035315 A1 2/2008 Han
2008/0054144 A1 3/2008 Wohlford
2008/0055261 A1 3/2008 Cernasov
2008/0055534 A1 3/2008 Kawano
2008/0076342 A1 3/2008 Bryant et al.
2008/0083527 A1 4/2008 Horng et al.
2008/0099193 A1 5/2008 Aksamit et al.
2008/0100186 A1 5/2008 Li
2008/0148609 A1 6/2008 Ogoreve
2008/0165496 A1 7/2008 Kang et al.
2008/0174456 A1 7/2008 Warren
2008/0190210 A1 8/2008 Harish et al.
2008/0209934 A1 9/2008 Richards
2008/0218446 A1 9/2008 Yamanaka
2008/0236005 A1 10/2008 Isayev et al.
2008/0255901 A1 10/2008 Carroll et al.
2008/0267790 A1 10/2008 Gaudet et al.
2008/0276507 A1 11/2008 Hines
2008/0283234 A1 11/2008 Sagi et al.
2008/0285290 A1 11/2008 Ohashi et al.
2008/0296134 A1 12/2008 Hattori et al.
2008/0304219 A1 12/2008 Chen
2008/0310116 A1 12/2008 O'Connor
2008/0310158 A1 12/2008 Harbers et al.
2009/0009041 A1 1/2009 Zeidler
2009/0009047 A1 1/2009 Yanagawa et al.
2009/0009729 A1 1/2009 Sakai
2009/0016004 A1 1/2009 McCoy
2009/0021461 A1 1/2009 Hu et al.
2009/0034188 A1 2/2009 Sween et al.
2009/0059518 A1 3/2009 Kakikawa et al.
2009/0065007 A1 3/2009 Wilkinson et al.
2009/0086430 A1 4/2009 Kang et al.
2009/0095819 A1 4/2009 Brown et al.
2009/0104989 A1 4/2009 Williams et al.
2009/0120629 A1 5/2009 Ashe
2009/0122218 A1 5/2009 Oh et al.
2009/0126906 A1 5/2009 Dunn
2009/0126907 A1 5/2009 Dunn
2009/0126914 A1 5/2009 Dunn
2009/0129021 A1 5/2009 Dunn
2009/0135365 A1 5/2009 Dunn
2009/0141199 A1 6/2009 Fujikawa
2009/0145581 A1 6/2009 Hoffman et al.
2009/0147170 A1 6/2009 Oh et al.
2009/0154096 A1 6/2009 Iyengar et al.
2009/0174626 A1 7/2009 Isoshima et al.
2009/0227167 A1 9/2009 Tannas, Jr.
2009/0231807 A1 9/2009 Bouissiere
2009/0241388 A1 10/2009 Dunn
2009/0241437 A1 10/2009 Steinle et al.
2009/0244472 A1 10/2009 Dunn
2009/0266507 A1 10/2009 Turnbull et al.
2009/0278007 A1 11/2009 Taylor
2009/0279240 A1 11/2009 Karppanen
2009/0302727 A1 12/2009 Vincent et al.
2009/0306820 A1 12/2009 Simmons et al.
2009/0323275 A1 12/2009 Rehmann et al.
2010/0060861 A1 3/2010 Medin
2010/0079949 A1 4/2010 Nakamichi et al.
2010/0079979 A1 4/2010 Nakamichi et al.
2010/0142149 A1 6/2010 Nakamichi et al.
2010/0162747 A1 7/2010 Hamel et al.
2010/0171889 A1 7/2010 Pantel et al.
2010/0182562 A1 7/2010 Yoshida et al.
2010/0213323 A1 8/2010 Tannas, Jr.
2010/0220249 A1 9/2010 Nakamichi et al.
2010/0226091 A1 9/2010 Dunn
2010/0232107 A1 9/2010 Dunn
2010/0238394 A1 9/2010 Dunn
2010/0297907 A1 11/2010 Tannas, Jr.
2010/0315570 A1 12/2010 Mathew et al.
2010/0321887 A1 12/2010 Kwon et al.
2011/0001898 A1 1/2011 Mikubo et al.
2011/0013114 A1 1/2011 Dunn et al.
2011/0019348 A1 1/2011 Kludt et al.
2011/0019363 A1 1/2011 Vahlsing et al.
2011/0032489 A1 2/2011 Kimoto et al.
2011/0051071 A1 3/2011 Nakamichi et al.
2011/0051369 A1 3/2011 Takahara
2011/0058326 A1 3/2011 Idems et al.
2011/0072697 A1 3/2011 Miller
2011/0075361 A1 3/2011 Nakamichi et al.
2011/0083460 A1 4/2011 Thomas et al.
2011/0083824 A1 4/2011 Rogers
2011/0085301 A1 4/2011 Dunn
2011/0085302 A1 4/2011 Nakamichi et al.
2011/0090630 A1 4/2011 Bergeron et al.
2011/0114384 A1 5/2011 Sakamoto et al.
2011/0116000 A1 5/2011 Dunn et al.
2011/0116231 A1 5/2011 Dunn et al.
2011/0122162 A1 5/2011 Sato et al.
2011/0134356 A1 6/2011 Swatt et al.
2011/0141672 A1 6/2011 Farley, Jr. et al.
2011/0141724 A1 6/2011 Erion
2011/0162831 A1 7/2011 Lee et al.
2011/0167845 A1 7/2011 Lee et al.
2011/0227467 A1 9/2011 Foppe, Jr. et al.
2011/0261523 A1 10/2011 Dunn et al.
2011/0297810 A1 12/2011 Tachibana
2012/0006523 A1 1/2012 Masahiro et al.
2012/0012295 A1 1/2012 Kakiuchi et al.
2012/0012300 A1 1/2012 Dunn et al.
2012/0014063 A1 1/2012 Weiss
2012/0020114 A1 1/2012 Miyamoto et al.
2012/0038849 A1 2/2012 Dunn et al.
2012/0044217 A1 2/2012 Okada et al.
2012/0050958 A1 3/2012 Sanford et al.
2012/0105424 A1 5/2012 Lee et al.
2012/0105790 A1 5/2012 Hubbard
2012/0106081 A1 5/2012 Hubbard et al.

(56) References Cited

U.S. PATENT DOCUMENTS

2012/0131936 A1 5/2012 Yoshida et al.
2012/0188481 A1 7/2012 Kang et al.
2012/0206687 A1 8/2012 Dunn et al.
2012/0223877 A1 9/2012 Cho
2012/0224116 A1 9/2012 Barnes
2012/0236499 A1 9/2012 Murayama et al.
2012/0249402 A1 10/2012 Kang
2012/0253672 A1 10/2012 Hoshino et al.
2012/0255704 A1 10/2012 Nakamichi
2012/0274876 A1 11/2012 Cappaert et al.
2012/0284547 A1 11/2012 Culbert et al.
2012/0327600 A1 12/2012 Dunn
2013/0069588 A1 3/2013 Oda et al.
2013/0170140 A1 7/2013 Dunn
2013/0173358 A1 7/2013 Pinkus
2013/0176517 A1 7/2013 Kim et al.
2013/0201685 A1 8/2013 Messmore et al.
2013/0211583 A1 8/2013 Borra
2013/0258659 A1 10/2013 Erion
2013/0270975 A1 10/2013 Dunn et al.
2013/0279154 A1* 10/2013 Dunn .................... F21V 29/67 362/97.3
2013/0294039 A1 11/2013 Chao
2013/0299651 A1 11/2013 McGowan et al.
2013/0329363 A1 12/2013 Dunn et al.
2013/0344794 A1 12/2013 Shaw et al.
2014/0044147 A1 2/2014 Wyatt et al.
2014/0055914 A1 2/2014 Fournier
2014/0085564 A1 3/2014 Hendren et al.
2014/0111758 A1 4/2014 Dunn et al.
2014/0113540 A1 4/2014 Dunn et al.
2014/0134767 A1 5/2014 Ishida et al.
2014/0184980 A1 7/2014 Onoue
2014/0190240 A1 7/2014 He et al.
2014/0208626 A1 7/2014 Moon
2014/0268657 A1 9/2014 Dunn et al.
2014/0313452 A1 10/2014 Dunn et al.
2014/0313666 A1 10/2014 Chin
2014/0313698 A1 10/2014 Dunn et al.
2014/0314395 A1 10/2014 Dunn et al.
2014/0334100 A1 11/2014 Yoon et al.
2014/0361138 A1 12/2014 Ramirez et al.
2015/0009625 A1 1/2015 Chin et al.
2015/0009627 A1 1/2015 Dunn et al.
2015/0087404 A1 3/2015 Lesley et al.
2015/0192371 A1 7/2015 Hancock
2015/0211676 A1 7/2015 Martin et al.
2015/0253611 A1 9/2015 Yang et al.
2015/0264826 A1 9/2015 Dunn et al.
2015/0319882 A1 11/2015 Dunn et al.
2015/0366101 A1 12/2015 Dunn et al.
2015/0371571 A1 12/2015 Häger
2016/0014910 A1 1/2016 Campagna et al.
2016/0041423 A1 2/2016 Dunn
2016/0044829 A1 2/2016 Dunn
2016/0121735 A1 5/2016 Sugano
2016/0162297 A1 6/2016 Shao
2016/0192536 A1 6/2016 Diaz
2016/0195254 A1 7/2016 Dunn et al.
2016/0198588 A1 7/2016 DeMars
2016/0238876 A1 8/2016 Dunn et al.
2016/0242329 A1 8/2016 DeMars
2016/0242330 A1 8/2016 Dunn
2016/0249493 A1 8/2016 Dunn et al.
2016/0265759 A1 9/2016 Na et al.
2016/0302331 A1 10/2016 Dunn
2017/0023823 A1 1/2017 Dunn et al.
2017/0068042 A1 3/2017 Dunn et al.
2017/0074453 A1 3/2017 Bowers et al.
2017/0083043 A1 3/2017 Bowers et al.
2017/0083062 A1 3/2017 Bowers et al.
2017/0111486 A1 4/2017 Bowers et al.
2017/0111520 A1 4/2017 Bowers et al.
2017/0111521 A1 4/2017 Bowers et al.
2017/0127579 A1 5/2017 Hubbard
2017/0140344 A1 5/2017 Bowers et al.
2017/0147992 A1 5/2017 Bowers et al.
2017/0163519 A1 6/2017 Bowers et al.
2017/0172016 A1 6/2017 Kang
2017/0175411 A1 6/2017 Bowers et al.
2017/0188490 A1 6/2017 Dunn et al.
2017/0231112 A1 8/2017 Dunn et al.
2017/0245400 A1 8/2017 Dunn et al.
2017/0257978 A1 9/2017 Diaz
2017/0318921 A1 11/2017 Gharabegian
2017/0332523 A1 11/2017 DeMars
2017/0345346 A1 11/2017 Hong et al.
2018/0020579 A1 1/2018 Chang et al.
2018/0042134 A1 2/2018 Dunn et al.
2018/0088368 A1 3/2018 Notoshi et al.
2018/0088398 A1 3/2018 Lee et al.
2018/0111495 A1 4/2018 Kinomura
2018/0116073 A1 4/2018 Dunn
2018/0199450 A1 7/2018 Kim et al.
2018/0259806 A1 9/2018 Oh et al.
2018/0263142 A1 9/2018 Oh et al.
2018/0310439 A1 10/2018 Oh et al.
2018/0314103 A1 11/2018 Dunn et al.
2018/0315356 A1 11/2018 Dunn et al.
2018/0317330 A1 11/2018 Dunn et al.
2018/0317350 A1 11/2018 Dunn et al.
2018/0345809 A1 12/2018 Derrien et al.
2018/0364519 A1 12/2018 Dunn et al.
2019/0021189 A1 1/2019 Kim et al.
2019/0037738 A1 1/2019 Dunn et al.
2019/0059175 A1 2/2019 Diaz
2019/0089176 A1 3/2019 Dunn et al.
2019/0133002 A1 5/2019 Dunn et al.
2019/0159363 A1 5/2019 Jang et al.
2019/0208674 A1 7/2019 Demars
2019/0239365 A1 8/2019 Dunn et al.
2019/0289754 A1 9/2019 Hubbard
2019/0327865 A1 10/2019 Dunn et al.
2019/0335613 A1 10/2019 Diaz
2020/0037456 A1 1/2020 Dunn
2020/0096797 A1 3/2020 Teragawa
2020/0154597 A1 5/2020 Dunn et al.
2020/0163234 A1 5/2020 Dunn
2020/0163235 A1 5/2020 Dunn
2020/0201402 A1 6/2020 Lee et al.
2020/0205303 A1 6/2020 Dunn et al.
2020/0241612 A1 7/2020 Moon et al.
2020/0253095 A1 8/2020 Dunn et al.
2020/0275585 A1 8/2020 Dunn
2020/0288585 A1 9/2020 Dunn et al.
2020/0319676 A1 10/2020 Dunn
2020/0352049 A1 11/2020 Dunn et al.
2020/0366104 A1 11/2020 Stanfield
2020/0367391 A1 11/2020 Dunn
2020/0369169 A1 11/2020 Mercer et al.
2020/0387194 A1 12/2020 Dunn
2020/0390004 A1 12/2020 Whitehead et al.
2020/0390009 A1 12/2020 Whitehead et al.
2021/0007241 A1 1/2021 Diaz
2021/0022273 A1 1/2021 Hubbard
2021/0094437 A1 4/2021 Tsubokura et al.
2021/0165472 A1 6/2021 Chin
2021/0168949 A1 6/2021 Dunn et al.
2021/0182919 A1 6/2021 Wyckoff et al.
2021/0231998 A1 7/2021 Noso et al.
2021/0243906 A1 8/2021 Dunn
2021/0243914 A1 8/2021 Dunn
2021/0304644 A1 9/2021 Webster
2021/0307214 A1 9/2021 Zhang et al.
2021/0345528 A1 11/2021 Dunn
2021/0400853 A1 12/2021 Choi
2021/0408676 A1 12/2021 Sainz Fuertes
2022/0035198 A1 2/2022 Dunn et al.
2022/0110227 A1 4/2022 Brown
2022/0121255 A1 4/2022 Wang et al.
2022/0132681 A1 4/2022 Dunn et al.
2022/0132707 A1 4/2022 Dunn et al.
2022/0252927 A1* 8/2022 Wang ................ G02F 1/133385
2022/0287200 A1 9/2022 Dunn et al.

(56) References Cited

U.S. PATENT DOCUMENTS

| | | | |
|---|---|---|---|
| 2022/0394861 | A1 | 12/2022 | Dunn et al. |
| 2022/0408616 | A1 | 12/2022 | Brown |
| 2022/0408617 | A1 | 12/2022 | Brown |
| 2023/0030742 | A1 | 2/2023 | Dunn et al. |
| 2023/0032626 | A1 | 2/2023 | Brown |
| 2023/0033017 | A1 | 2/2023 | Dunn |
| 2023/0036767 | A1 | 2/2023 | Dunn et al. |
| 2023/0056061 | A1 | 2/2023 | Dunn et al. |
| 2023/0058547 | A1 | 2/2023 | Dunn et al. |
| 2023/0059819 | A1 | 2/2023 | Dunn et al. |
| 2023/0160774 | A1 | 5/2023 | Dunn et al. |
| 2023/0164964 | A1 | 5/2023 | Dunn et al. |
| 2023/0200031 | A1 | 6/2023 | Dunn |
| 2023/0209786 | A1 | 6/2023 | Dunn |
| 2023/0345683 | A1 | 10/2023 | Dunn et al. |
| 2023/0359077 | A1 | 11/2023 | Dunn et al. |
| 2023/0422431 | A1 | 12/2023 | Dunn et al. |
| 2023/0422453 | A1 | 12/2023 | Dunn |
| 2024/0032238 | A1 | 1/2024 | Dunn et al. |
| 2024/0114633 | A1 | 4/2024 | Dunn |

FOREIGN PATENT DOCUMENTS

| | | | |
|---|---|---|---|
| AU | 2015253128 | B2 | 3/2018 |
| AU | 2017216500 | B2 | 1/2019 |
| AU | 2015229457 | B2 | 3/2019 |
| AU | 2016220308 | B2 | 3/2019 |
| AU | 2017228430 | B2 | 3/2020 |
| AU | 2018258497 | B2 | 1/2021 |
| AU | 2018257648 | B2 | 2/2021 |
| AU | 2019315350 | B2 | 9/2022 |
| BR | PI0820231-1 | | 2/2019 |
| CA | 2705814 | C | 2/2018 |
| CA | 2947524 | C | 4/2018 |
| CA | 2915261 | C | 8/2018 |
| CA | 2780884 | C | 4/2019 |
| CA | 2798277 | C | 6/2019 |
| CA | 2809019 | C | 9/2019 |
| CA | 2888494 | C | 9/2019 |
| CA | 2976116 | C | 11/2020 |
| CA | 3015365 | C | 8/2021 |
| CA | 3059972 | C | 1/2022 |
| CA | 2942321 | C | 6/2022 |
| CA | 3059928 | C | 11/2022 |
| CN | 2702363 | Y | 5/2005 |
| CN | 201228893 | Y | 4/2009 |
| CN | 202838830 | U | 3/2013 |
| CN | 104640422 | A | 5/2015 |
| CN | 106304788 | A | 1/2017 |
| CN | 107251671 | A | 10/2017 |
| CN | 108700739 | A | 10/2018 |
| CN | 107251671 | B | 8/2019 |
| CN | 216697703 | U | 6/2022 |
| EP | 1408476 | A1 | 4/2004 |
| EP | 1647766 | A2 | 4/2006 |
| EP | 1722559 | A1 | 11/2006 |
| EP | 1762892 | A1 | 3/2007 |
| EP | 1951020 | A1 | 7/2008 |
| EP | 2225603 | A2 | 9/2010 |
| EP | 2370987 | A2 | 10/2011 |
| EP | 2587175 | A1 | 5/2013 |
| EP | 2603831 | A2 | 6/2013 |
| EP | 2801888 | A2 | 11/2014 |
| EP | 2909829 | A1 | 8/2015 |
| EP | 3020260 | A2 | 5/2016 |
| EP | 3040766 | A1 | 7/2016 |
| EP | 3117693 | A2 | 1/2017 |
| EP | 3259968 | A1 | 12/2017 |
| EP | 3423886 | A0 | 1/2019 |
| EP | 3468321 | A1 | 4/2019 |
| EP | 3138372 | B1 | 5/2019 |
| EP | 3117693 | B1 | 8/2019 |
| EP | 2567283 | B1 | 10/2019 |
| EP | 2909829 | B1 | 2/2020 |
| EP | 3615978 | A1 | 3/2020 |
| EP | 3616481 | A1 | 3/2020 |
| EP | 3624574 | A1 | 3/2020 |
| EP | 3468321 | B1 | 4/2021 |
| EP | 3830464 | A1 | 6/2021 |
| EP | 3423886 | B1 | 2/2022 |
| EP | 3259968 | B1 | 4/2022 |
| EP | 4232870 | A1 | 8/2023 |
| EP | 3615978 | B1 | 1/2024 |
| FR | 2893752 | A1 | 5/2007 |
| GB | 153110 | | 11/1920 |
| GB | 2402205 | A | 12/2004 |
| JP | 402062015 | A | 3/1990 |
| JP | 402307080 | A | 12/1990 |
| JP | 3153212 | A | 7/1991 |
| JP | H497194 | A | 3/1992 |
| JP | H06-2337 | U | 1/1994 |
| JP | 6082745 | A | 3/1994 |
| JP | H8-54834 | A | 2/1996 |
| JP | H8-55567 | A | 2/1996 |
| JP | 8115788 | A | 5/1996 |
| JP | H8-152604 | A | 6/1996 |
| JP | 8194437 | A | 7/1996 |
| JP | H08-305301 | A | 11/1996 |
| JP | 8339034 | A | 12/1996 |
| JP | H9-160512 | A | 6/1997 |
| JP | H09246766 | A | 9/1997 |
| JP | H10152604 | A | 6/1998 |
| JP | H-10222076 | A | 8/1998 |
| JP | H11-68363 | A | 3/1999 |
| JP | 11160727 | A | 6/1999 |
| JP | H-11233967 | A | 8/1999 |
| JP | H11296094 | A | 10/1999 |
| JP | 2000-10501 | A | 1/2000 |
| JP | 2000112033 | A | 4/2000 |
| JP | 2000131682 | A | 5/2000 |
| JP | 3118907 | B2 | 10/2000 |
| JP | 2001209125 | A | 8/2001 |
| JP | 2001209126 | A | 8/2001 |
| JP | 2001-249402 | A | 9/2001 |
| JP | 2001326488 | A | 11/2001 |
| JP | 2002-6282 | A | 1/2002 |
| JP | 2002006757 | A | 1/2002 |
| JP | 2002148714 | A | 5/2002 |
| JP | 2002158475 | A | 5/2002 |
| JP | 2003036032 | A | 2/2003 |
| JP | 2003-76286 | A | 3/2003 |
| JP | 2003-162228 | A | 6/2003 |
| JP | 2003173147 | A | 6/2003 |
| JP | 2004053749 | A | 2/2004 |
| JP | 2004-199675 | A | 7/2004 |
| JP | 2004193002 | A | 7/2004 |
| JP | 2004285940 | A | 10/2004 |
| JP | 2004286940 | A | 10/2004 |
| JP | 2005017434 | A | 1/2005 |
| JP | 2005017556 | A | 1/2005 |
| JP | 2005134849 | A | 5/2005 |
| JP | 2005181799 | A | 7/2005 |
| JP | 2005265922 | A | 9/2005 |
| JP | 2005292939 | A | 10/2005 |
| JP | 2005332253 | A | 12/2005 |
| JP | 2006010851 | A | 1/2006 |
| JP | 2006-32890 | A | 2/2006 |
| JP | 2006513577 | A | 4/2006 |
| JP | 2006148047 | A | 6/2006 |
| JP | 2006163217 | A | 6/2006 |
| JP | 2006-176112 | A | 7/2006 |
| JP | 2006198344 | A | 8/2006 |
| JP | 2006293062 | A | 10/2006 |
| JP | 2006317494 | A | 11/2006 |
| JP | 2006-330196 | A | 12/2006 |
| JP | 2007003638 | A | 1/2007 |
| JP | 2007052951 | A | 3/2007 |
| JP | 2007207595 | A | 8/2007 |
| JP | 2007-293105 | A | 11/2007 |
| JP | 09307257 | A | 11/2007 |
| JP | 2007322718 | A | 12/2007 |
| JP | 2008010361 | A | 1/2008 |
| JP | 2008292743 | A | 12/2008 |
| JP | 2010024624 | A | 2/2010 |

(56) References Cited

FOREIGN PATENT DOCUMENTS

JP 2010-102227 A 5/2010
JP 2010-282109 A 12/2010
JP 2011-14593 A 1/2011
JP 2011-503663 A 1/2011
JP 2011-75819 A 4/2011
JP 2012-118130 A 6/2012
JP 2012-133254 A 7/2012
JP 2013-537721 A 10/2013
JP 2014-225595 A 12/2014
JP 6039450 B2 12/2016
JP 2017518526 A 7/2017
JP 2018-511838 A 4/2018
JP 6305564 B2 4/2018
JP 2019-512721 A 5/2019
JP 6526245 B2 5/2019
JP 6688402 B2 4/2020
JP 6824440 B2 1/2021
JP 6858276 B2 3/2021
KR 20000000118 U 1/2000
KR 200163508 Y1 7/2000
KR 20000047899 A 7/2000
KR 200206768 Y1 12/2000
KR 20010044073 A 6/2001
KR 200236278 Y1 10/2001
KR 10-2067751 B1 1/2002
KR 2002-0057425 A 7/2002
KR 200286961 Y1 8/2002
KR 100673470 B1 1/2004
KR 1020040067701 A 7/2004
KR 200366674 Y1 11/2004
KR 20050033986 A 4/2005
KR 20050036254 A 4/2005
KR 200401354 Y1 11/2005
KR 20060016469 A 2/2006
KR 10-0563049 B1 3/2006
KR 20060054742 A 5/2006
KR 10-2006-0070176 A 6/2006
KR 20060091898 A 8/2006
KR 20060120904 A 11/2006
KR 100659339 B1 12/2006
KR 100666961 B1 1/2007
KR 20070002494 A 1/2007
KR 1020070070675 A 4/2007
KR 10-2007-0048300 A 5/2007
KR 20070048296 A 5/2007
KR 1020070048294 8/2007
KR 20080005024 A 1/2008
KR 20080010091 A 1/2008
KR 20080018486 A 2/2008
KR 20080047241 A 5/2008
KR 20090116368 A 11/2009
KR 10-1153923 B1 6/2012
KR 10-2013-0126034 A 11/2013
KR 101764381 B1 7/2017
KR 10-1847151 B1 4/2018
KR 10-1853885 B1 4/2018
KR 10-1868077 B1 6/2018
KR 10-1885884 B1 7/2018
KR 10-1894027 B1 8/2018
KR 10-1904363 B1 9/2018
KR 10-1958375 B1 3/2019
KR 10-2010515 B1 8/2019
KR 10-2063885 1/2020
KR 10-2104342 B1 4/2020
KR 10-2109072 B1 5/2020
KR 10-2165778 B1 10/2020
KR 10-2262912 B1 6/2021
KR 10-2267374 B1 6/2021
KR 10-2306650 B1 9/2021
KR 10-2379046 B1 3/2022
KR 10-2400990 B1 5/2022
KR 10-2501211 B1 2/2023
KR 10-2512657 B1 3/2023
RU 2513043 C2 4/2014
WO WO2005079129 A1 8/2005
WO WO2007/116117 A1 10/2007
WO WO2007116116 A1 10/2007
WO WO2008050660 A2 5/2008
WO WO2008085138 A 7/2008
WO WO2008/102050 A1 8/2008
WO WO2009/047390 A1 4/2009
WO WO2009065125 A2 5/2009
WO WO2009065125 A3 5/2009
WO WO2009135308 A1 11/2009
WO WO2010007821 A1 2/2010
WO WO2010080624 A2 7/2010
WO WO2011059793 A2 5/2011
WO WO2011069084 A3 6/2011
WO WO2011072217 A3 6/2011
WO WO2011140179 A2 11/2011
WO WO2011150078 A2 12/2011
WO WO2012006620 A2 1/2012
WO WO2012021573 A2 2/2012
WO WO2012024426 A3 2/2012
WO WO2013/182733 A1 12/2013
WO WO2014062815 A1 4/2014
WO WO2014149773 A1 9/2014
WO WO2014150036 A1 9/2014
WO 2014/195560 A1 12/2014
WO 2015138609 A2 9/2015
WO WO2015168375 A1 11/2015
WO 2016102980 A1 6/2016
WO WO2016102982 A1 6/2016
WO WO2016127613 A1 8/2016
WO WO2016133852 A1 8/2016
WO WO2017152166 A1 9/2017
WO WO2018/200260 A1 11/2018
WO WO2018/200905 A1 11/2018
WO 2020028045 A1 2/2020
WO WO2020/081687 A1 4/2020
WO WO2020/205305 A1 10/2020
WO WO2022/087488 A1 4/2022
WO WO2023/096738 A1 6/2023
WO WO2024/020185 A1 1/2024

OTHER PUBLICATIONS

The Free Dictionary, Screw—Definition of screw by The Free Dictionary, Jun. 15, 2016, 1 Page.

I-Tech Company, 65" Outdoor Digital Signage Sunlight All Weather Proof LCD, 1 Page.

Sunlightlcd.com, 46" All Weather NEMA4 Outdoor High Brightness (Model: GS4600L), Mar. 11, 2009, 2 Pages.

Miller, Adnation, photos, May 9, 2017, 28 pages.

Civiq, Smartscapes devices, webpage, Jan. 30, 2019, 1 page.

Civiq, Smart City Platform, webpage, Jan. 30, 2019, 10 pages.

Civiq, Smart City Devices, webpage, Jan. 30, 2019, 5 pages.

Civiq, Invalidity Claim Chart, Appendix E, Jan. 24, 2018, 28 pages.

Mentley, David E., State of Flat-Panel Display Technology and Future Trends, Proceedings of the IEEE, Apr. 2002, vol. 90, No. 4, pp. 453-459.

Rohsenow, Warren M., Handbook of Heat Transfer, Third Edition, 1998, select chapters, 112 pages, McGraw-Hill.

The American Heritage College Dictionary, Third Edition, 1993, excerpt, 3 pages, Houghton Company.

*Civiq Smartscapes LLC.* V *Manufacturing Resources International, Inc.*, Petition for Inter Partes Review of U.S. Pat. No. 8,854,572 including Declaration of Greg Blonder in Support of Petition, Curriculum Vitae of Greg Blonder and Prosecution History of U.S. Pat. No. 8,854,572, Petition filed Mar. 14, 2018, 427 pages.

*Civiq Smartscapes LLC.* V *Manufacturing Resources International, Inc.*, Petition for Inter Partes., Defendant's Amended Answer and Countercliams to Plaintiff's First Amended Complaint, Filed Apr. 24, 2018, 240 pages.

*Civiq Smartscapes LLC.* V *Manufacturing Resources International, Inc.*, Petition for Inter Partes., Memorandum Order re "rear surface of the electronic display" term construction, Mar. 5, 2019, 3 pages.

United States International Trade Commission, *Manufacturing Resources International, Inc.* v *Samsung Electronics Co., Ltd et al.*, In the Matter of Certain Outdoor and Semioutdoor Electronic Displays,

(56) References Cited

OTHER PUBLICATIONS

Products Containing Same, and Components Thereof, Inv. No. 337-TA-1331, Final Initial Determination of Violation of Section 337, Public Version, Nov. 13, 2023, 325 pages.
Declaration of Robert Smith Gillespie, Certain Outdoor and Semi-outdoor Electronic Displays, Products, Containing same, and Components thereof, Jan. 17, 2023, 42 pages.
*Samsung Electronics Co., Ltd and Samsung Electronics America, Inc.* v *Manufacturing Resources International, Inc.*, Declaration of Michael Gershowitz, Sep. 26, 2023, 77 pages.
*Samsung Electronics Co., Ltd and Samsung Electronics America, Inc.* v *Manufacturing Resources International, Inc.*, Expert Declaration of Dr. Himanshu Pokhama,, Sep. 26, 2023, 104 pages.
*Samsung Electronics Co., Ltd and Samsung Electronics America, Inc.* v *Manufacturing Resources International, Inc.*, Decision to Institute IPR2023-00199, Jun. 20, 2023, 53 pages.
*Samsung Electronics Co., Ltd and Samsung Electronics America, Inc.* v *Manufacturing Resources International, Inc.*, Decision to Institute IPR2023-00220, Jun. 20, 2023, 51 pages.
*Samsung Electronics Co., Ltd and Samsung Electronics America, Inc.* v *Manufacturing Resources International, Inc.*, Decision to Institute IPR2023-00221, Jun. 20, 2023, 80 pages.
*Samsung Electronics Co., Ltd and Samsung Electronics America, Inc.* v *Manufacturing Resources International, Inc.*, Decision to Institute IPR2023-00254, Jun. 20, 2023, 72 pages.
*Samsung Electronics Co., Ltd and Samsung Electronics America, Inc.* v *Manufacturing Resources International, Inc.*, Decision to Institute IPR2023-00255, Jul. 18, 2023, 47 pages.
Itsenclosures, Product Catalog, 2009, 48 pages.
Itsenclosures, Standard Product Data Sheet, 2011, 18 pages.
Sunbritetv, All Weather Outdoor LCD Television Model 4610HD, 2008, 1 page.
Sunbritetv, Introduces Two New All-Weather Outdoor Televisions InfoComm 2008, 7 pages.
Itsenclosures, Viewstation, 2017, 16 pages.
Novitsky, Driving LEDs versus CCFLs for LCD backlighting, Nov. 12, 2007, 6 pages.
Federman, Cooling Flat Panel Displays, 2011, 4 pages.
Zeeff, T.M., EMC analysis of an 18" LCD monitor, 2000, 1 page.
Vertigo Digital Displays, Innovation on Display FlexVu Totem Brochure, 2014, 6 pages.
Vertigo Digital Displays, FlexVu Totem Shelter, 2017, 2 pages.
Vertigo Digital Displays, All Products Catalogue, 2017,14 pages.
Adnation, Turn Key Advertising Technology Solutions, May 23, 2017, 4 pages.
Civiq Smartscapes, FlexVue Ferro 55P/55L, Mar. 16, 2017, 4 pages.
Wankhede, Evaluation of Cooling Solutions for Outdoor Electronics, Sep. 17-19, 2007, 6 pages.
Bureau of Ships Navy Department, Guide Manual of Cooling methods for Electronic Equipment, Mar. 31, 1955, 212 pages.
Civiq, Invalidity Claim Charts, Appendix A-Appendix D, Jan. 24, 2018, 51 pages.
Civiq, Invalidity Contentions, Jan. 24, 2018, 51 pages.
Scott, Cooling of Electronic Equipment, Apr. 4, 1974, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.
Civiq, Invalidity Claim Chart, Appendix I, Mar. 22, 2018, 4 pages.
Civiq, Invalidity Claim Charts, Appendix F to H, Mar. 22, 2018, 18 pages.
Yung, Using Metal Core Printed Circuit Board as a Solution for Thermal Management article, 2007, 5 pages.
*Civiq Smartscapes, LLC* V. *Manufacturing Resources International, Inc.*, Memorandum Opinion re claim construction, Sep. 27, 2018, 16 pages.
*Civiq Smartscapes, LLC* V. *Manufacturing Resources International, Inc.*, Claim Construction Order, Oct. 3, 2018, 2 pages.
Anandan, Munismay, Progress of LED backlights for LCDs, Journal of the SID, 2008, pp. 287-310, 16/2.
Melford Technologies, Part 2, video online at https://m.youtube.com/watch?v=znlyHWozwDA, Oct. 21, 2019, 1 page.

* cited by examiner 100
116
114
115
112
108D
Detail A
Detail B
108C

100

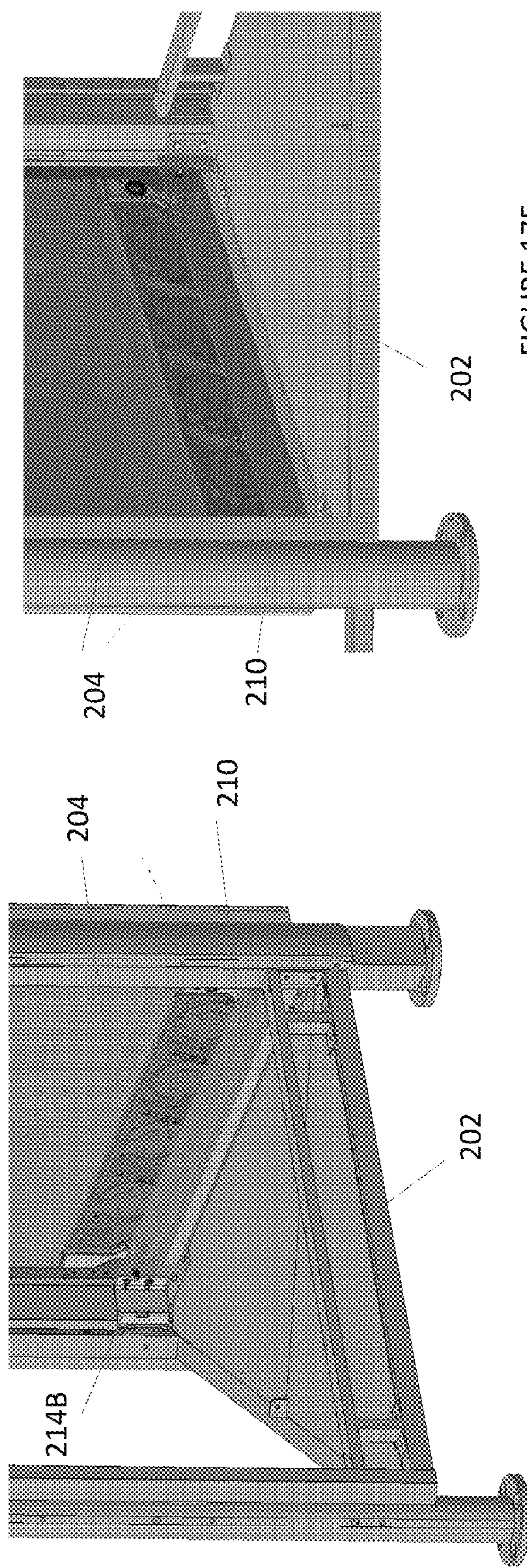
FIGURE 17E
FIGURE 17D
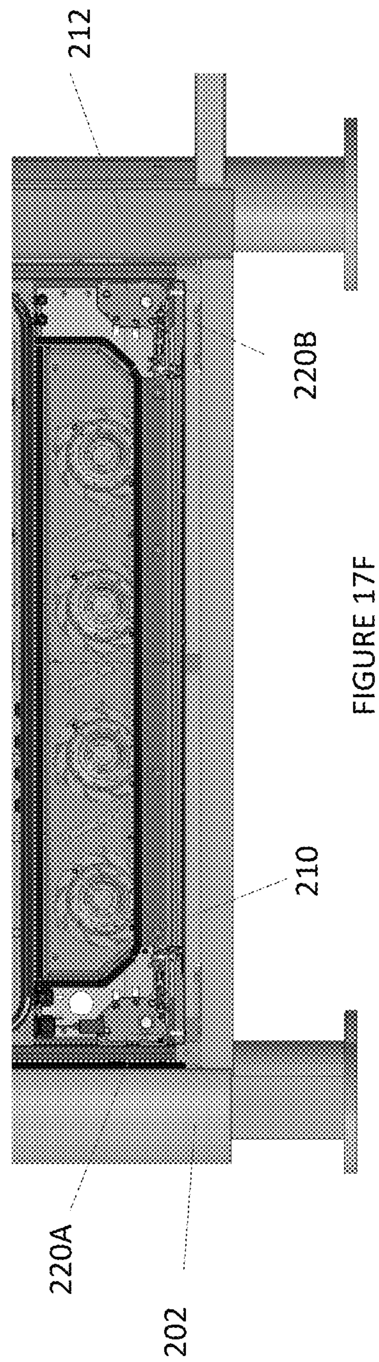
FIGURE 17F

SELF-CONTAINED ELECTRONIC DISPLAY ASSEMBLY, MOUNTING STRUCTURE AND METHODS FOR THE SAME

CROSS-REFERENCE TO RELATED APPLICATIONS

This application is a continuation of U.S. application Ser. No. 18/233,525 filed Aug. 14, 2023, which is a continuation-in-part of U.S. application Ser. No. 17/870,913 filed Jul. 22, 2022, the disclosures of which are hereby incorporated by reference as if fully restated herein.

TECHNICAL FIELD

Exemplary embodiments relate generally to self-contained electronic display assemblies as well as mounting structures and methods related to the same.

BACKGROUND AND SUMMARY OF THE INVENTION

The demand for digital out of home ("DOOH") advertising units has grown significantly in recent years. However, public and private real-estate space remains highly sought after and expensive. Advertisers are increasingly looking for new areas and mediums to provide advertising and other public announcement opportunities. What is needed is a display assembly that is adapted for installation at a variety of environments.

A self-contained electronic display assembly, as well as a mounting structure and methods for the same are provided. The disclosed self-contained electronic display assembly is adapted for installation at a variety of environments, such as by virtue of its largely, or entirely, self-contained nature. The mounting structure is highly adaptable for relatively simple installation in a number of different environments. Each of the electronic display assemblies may comprise a dedicated open loop airflow pathway and/or a dedicated closed loop airflow pathway. The closed loop airflow pathway may encircle an electronic display. The open loop airflow pathway may extend along a backlight for the electronic display. Other airflow configurations may be utilized.

The mounting structure may be configured to flexibly accommodate a variety of electronic equipment. Some or all of the electronic equipment may not necessarily be required for operation of the electronic display assemblies. For example, without limitation, the mounting structure may be configured to accommodate and/or provide electrical power and/or network connectivity to, electric vehicle ("EV") charging equipment, power transformers, traffic control devices, parking meters, street lighting equipment, and/or other civil or government and/or privately owned equipment. This may permit increased opportunity to place units within existing street or other public spaces.

The mounting structure may be configured to removably accept one or more of the electronic display assemblies. In exemplary embodiments, without limitation, the mounting structure is configured to accept two of the electronic display assemblies on opposing sides thereof.

In exemplary embodiments, without limitation, the mounting structure may comprise one or more hooks. For example, a set of one or more hooks may be installed to, provided at, and/or form part of a framework for connection to a ground surface, wall, or the like, and/or directly to a wall or other structure without the need for a separate framework. A complementary set of one or more hooks may be installed to, provided at, and/or form part of the electronic display assemblies. The hooks may be configured to mate with one another, preferably in a selectively removable fashion such that the electronic display assemblies may be removably installed. The complementary hooks may be configured to permit rotational movement of the electronic display assemblies when mounted. This arrangement may be used for newly constructed and/or installed units and/or to retrofit existing street furniture and other structures, such as but not limited to bus shelters.

The mounting structure may comprise a dedicated, open loop airflow pathway between the electronic display assemblies to thermally manage some or all of the electronic equipment. The open loop airflow pathway of the mounting structure may be wholly or partially separate from the open and/or closed loop airflow pathways of the electronic display assemblies, such as in accordance with various ingress protection ("IP") standards.

The mounting structure may be relatively compact for transportation. The mounting structure may permit removable attachments of the electronic display assemblies such that they may be removed for proper orientation during transport.

Alternative to a dedicated mounting structure, the electronic display assemblies may be configured for mounting to existing building walls, EV charging equipment, power transformers, traffic control devices, parking meters, street lighting equipment, and/or other civil or government and/or privately owned equipment or other buildings, structures, and/or surfaces.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein:

FIG. 17D is a detailed rear perspective view of the mounted display of FIGS. 16A and 16F;

FIG. 17E is another detailed rear perspective view of the mounted display of FIG. 17D; and FIG. 17F is a detailed rear view of the mounted display of FIG. 17D.

DETAILED DESCRIPTION OF EXEMPLARY EMBODIMENT(S)

Figures 1, 2:
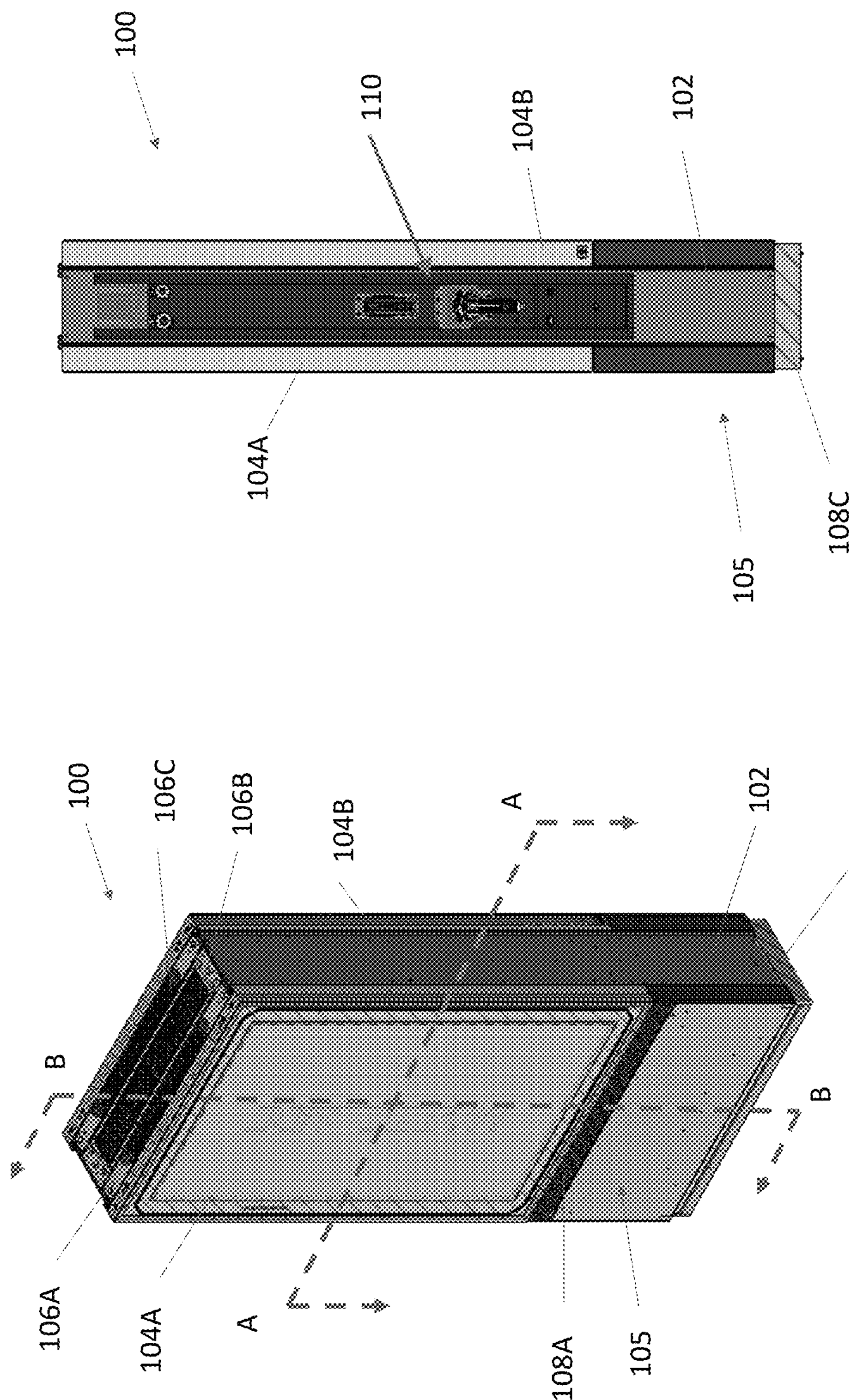
FIG. 1 is a perspective view of an exemplary display assembly also illustrating section lines A-A and B-B.
FIG. 2 is a side view of the display assembly of FIG. 1.
Figure 4:
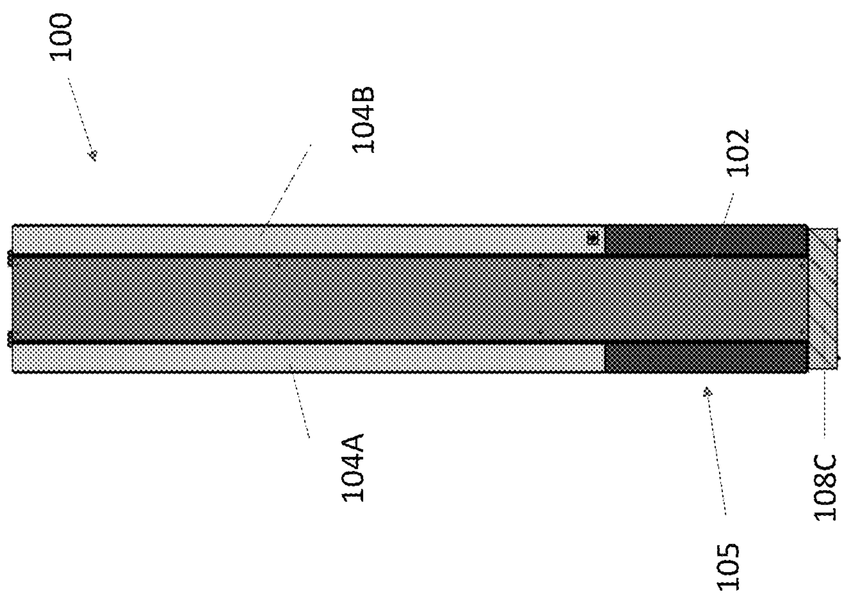
FIG. 4 is a side view of the display assembly of FIG. 1.
Figure 3:
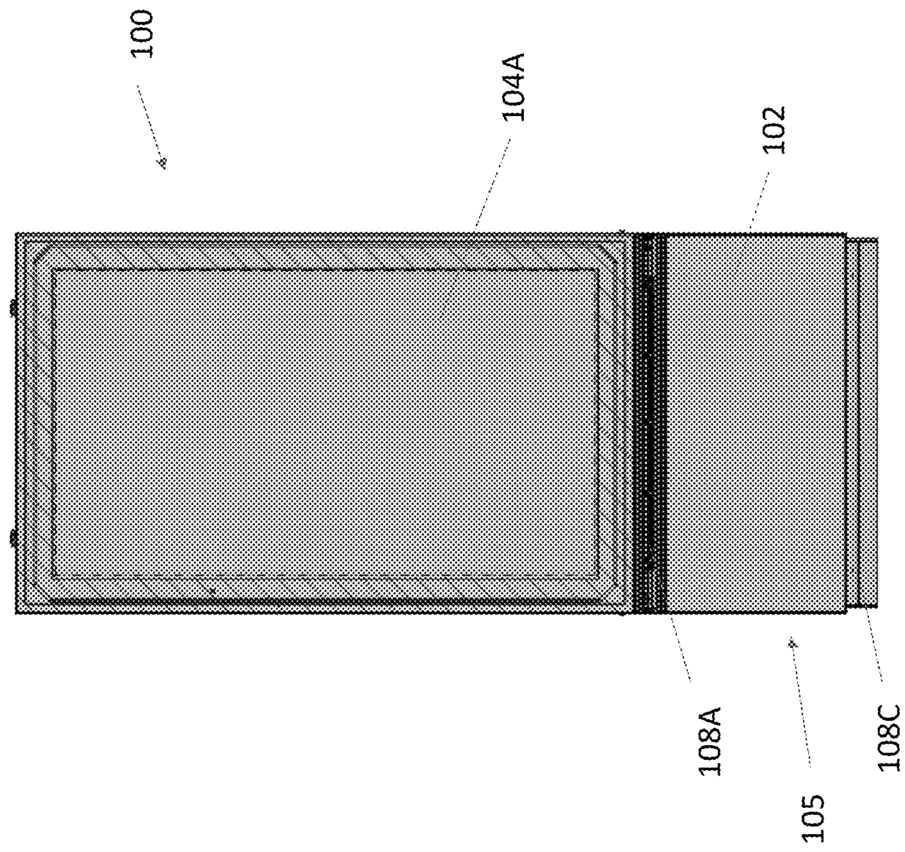
FIG. 3 is a front view of the display assembly of FIG. 1.

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

FIG. 1 through FIG. 4 illustrate an exemplary display assembly 100. The assembly 100 may comprise a mounting structure 102. The mounting structure 102 may be configured to accept one or more side assemblies 104. The side assemblies 104 sometimes also being referred to electronic display assemblies 104, or individually as an electronic display assembly 104. In exemplary embodiments, without limitation, the mounting structure 102 may be configured to receive a first side assembly 104A on a first side of the mounting structure 102 and a second side assembly 104B on a second side of the mounting structure 102, which may oppose the first side of the mounting structure 102. However, the mounting structure 102 may be configured to accept any number of side assemblies 104 in any arrangement.

The mounting structure 102 may be configured to for connection to a surface, such as but not limited to, a ground surface, a sidewalk, parking lot, a street, a building wall, poles, electrical boxes, transformers, ceilings, floors, combinations thereof, or the like. Alternatively, or additionally, the electronic display assemblies 104 may be configured for mounting directly to a ground surface, a sidewalk, parking lot, a street, a building wall, poles, electrical boxes, transformers, ceilings, floors, combinations thereof, or the like, without the need for a dedicated mounting structure 102, and/or such items may serve as part or all of the mounting structure 102.

The mounting structure 102 may comprise one or more structural members formed into a frame. Any number, size, and/or shape of structural members formed into any size and/or shape frame may be utilized. The mounting structure 102 may comprise one or more cladding components, panels, combinations thereof, or the like. For example, without limitation, the cladding components, panels, or the like may be snap fitted, fastened, adhered, hung, and/or otherwise connected to the structural members to form at least part of a housing.

The mounting structure 102 may comprise one or more apertures or other features configured to accept fasteners, adhesives, structural members, combinations thereof, or the like, for connecting the mounting structure 102 to a surface. The mounting structure 102 may comprise one or more apertures, pass through devices, combinations thereof, or the like, for accepting electrical and/or communication network wires and/or cables, such as for connecting components to utility power and/or communications networks such as the world wide web.

In exemplary embodiments, without limitation, the mounting structure 102 may be configured to accept the side assemblies 104 in a manner which permits movement of the side assemblies 104, such as between a closed position where the side assemblies 104 rest against, and/or are secured to, the mounting structure 102 and an opened position where the side assemblies 104 are moved away from the mounting structure 102. Movement may be provided in a hinging manner or otherwise.

The mounting structure 102 may comprise, or be configured to accept, electric vehicle ("EV") charging equipment 110. In exemplary embodiments, the display assembly 100 may comprise a recessed compartment 116 which extends within a portion of the mounting structure 102 and which is configured to accept certain EV charging equipment 110 such as, but not limited to, cables, connectors, plugs, outlets, user interfaces, point of sale devices, pulleys, retractable coils, combinations thereof, or the like. In exemplary embodiments, a user facing portion of the EV charging equipment 110 may be located at, or within, external facing portions of the recessed compartment 116 while other components of the EV charging equipment 110 may be located at, or within, the mounting structure 102.

The assembly 100 may comprise one or more intake areas 106. In exemplary embodiments, the mounting structure 102 may comprise a first intake area 106B and each of the side assemblies 104 may comprise an additional intake area 106A, 106C, though one or more common intakes 106 may be utilized. The intake areas 106 may comprise, for example, without limitation, one or more apertures, grates, filters, screens, combinations thereof, or the like. The intake areas 106 may be configured to accept ambient air from outside the assembly 100. Alternatively, the mounting structure 102 may comprise the additional intake areas 106A, 106C which may be in fluid communication with the side assemblies 104.

The mounting structure 102 and/or the side assemblies 104 may comprise one or more exhaust areas 108. In exemplary embodiments, without limitation, one of the exhaust areas 108A, 108B may be associated with each of the side assemblies 104A, 104B. For example, without limitation, the exhaust areas 108A, 108B may be provided at a lower portion of the side assemblies 104A, 104B or at the mounting structure 102 along the lower edge of the side assemblies 104A, 104B. A first one of the exhaust areas 108A may be associated with a first one of the side assemblies 104A and located at a first side of the assembly 100 while a second one of the exhaust areas 108B may be associated with a second one of the side assemblies 104B and located at a second side of the assembly 100 in exemplary embodiments, without limitation. Each of the exhaust areas 108A, 108B may be in fluid communication with a respective one of the intake areas 106A, 106C, such that each of the airflows is kept separate, though such is not required. The exhaust areas 108A, 108B may be located elsewhere.

One or more additional exhaust areas 108C, 108D may be provided for the intake area 106B associated with the mounting structure 102. The additional exhaust areas 108C, 108D may be provided at a bottom portion of the mounting structure 102 in exemplary embodiments, without limitation. The additional exhaust areas 108C, 108D may be in fluid communication with the intake area 106B. A first one of the additional exhaust areas 108C may be provided at a first side of the assembly 100 and a second one of the additional exhaust areas 108C may be provided at a second side of the assembly 100, for example, without limitation. The additional exhaust areas 108C, 108D may be located elsewhere.

The exhaust areas 108 may comprise, for example, without limitation, one or more apertures, grates, filters, screens, combinations thereof, or the like. The exhaust areas 108 may be configured to exhaust the ambient air previously ingested through the intake areas 106. In exemplary embodiments, without limitation, each of the exhaust areas 108 may be fluidly connected with just one of the intake areas 106, though common intakes 106 and/or exhausts 108 may be utilized. In other exemplary embodiments, airflow through the assembly 100 may be reversed such that the items shown and/or described as intake areas 106 may serve as exhaust areas 108 and the items shown and/or described as exhaust areas 108 may serve as intake areas 106.

The mounting structure 102 may be configured to interchangeably accept the electronic display assemblies 104, blank covers, static poster holders, combinations thereof, or the like. The electronic display assemblies 104, blank covers, and/or static poster holders may be removed for transportation such that a number of the electronic display assemblies 104, blank covers, and/or static poster holders may be transported in their desired and/or proper orientation, such as with the mounting structure 102. For example, without limitation, all such components may be placed within a single shipping crate in this fashion.

The mounting structure 102, in exemplary embodiments, without limitation, may be first secured at an installation site, such as by passing one or more bolts into an adjacent surface. Power supplies and/or network connectivity wires may be passed into the mounting structure 102, such as but not limited to, by way of one or more pass-through devices, holes, or the like. The electronic display assemblies 104, blank covers, and/or static poster holders may thereafter be installed. The certain components of the assembly 100 may be connected to the power supplies, network connectivity wires, and/or other electronic components, directly or indirectly, as required for operation.

Figure 5:
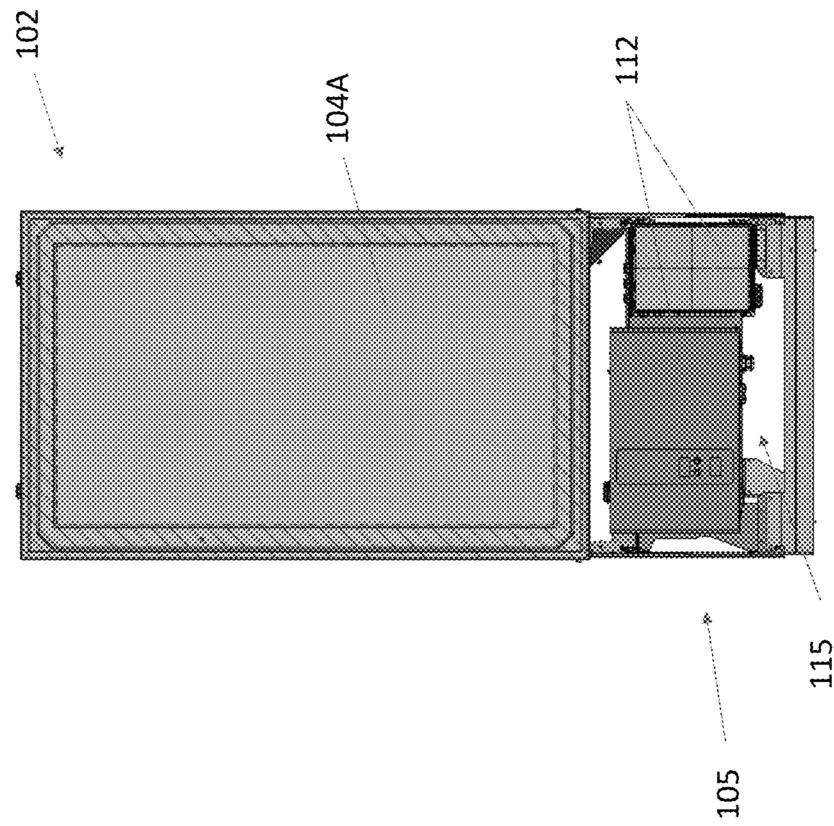
FIG. 5 is a front view of a mounting structure of the display assembly of FIG. 1 with side assemblies installed thereon but certain cladding components removed.

FIG. 5 illustrates the assembly 100 with certain cladding and/or panels removed so as to expose exemplary electronic equipment 112 installed within a lower cavity 115 of a lower area 105. The lower area 105 may comprise an area located below the side assemblies 104 when installed at the mounting structure 102. The lower area 105 and associated lower cavity 115 may be defined, at least in part, by the mounting structure 102.

The electronic equipment 112 may comprise, for example without limitation, EV charging equipment 110 (e.g., power modules, transformers, power distribution modules, power controllers, bulk energy storage devices, AC/DC converters, wiring or cable, combinations thereof, or the like), and/or equipment for side assembly 104 and/or assembly 100 functionality, including but not limited to, power modules, transformers, video players, network connectivity equipment (e.g., wireless transmitters/receivers, routers, radios, antennae, combinations thereof, or the like), sensors (e.g., air quality, pressure, temperature, humidity, accelerometer, magnetometers, combinations thereof, or the like), cameras, microphones, location tracking devices, position measurement systems, communications equipment, electronic storage devices, processors, controllers, edge computing devices, user interfaces, tablet computers, touch screen controllers, point of sale devices, government and/or private equipment (e.g., parking meters, electric meters, utility power supply equipment, traffic controllers, communications network equipment) combinations thereof, or the like. Any type or kind of electronic equipment 112 may be provided. Various structure for accommodating the electronic equipment 112, such as but not limited to, one or more plates, panels, rails, shelves, server racks, combinations thereof, or the like, may be provided within the lower cavity 115.

Figure 7:
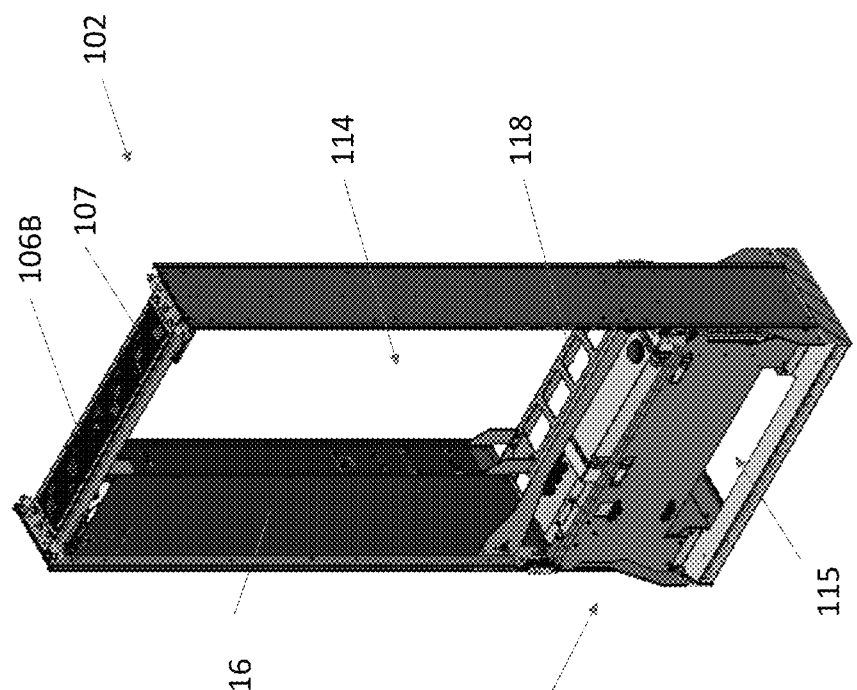
FIG. 7 is a perspective view of the mounting structure of FIG. 6.
Figure 6:
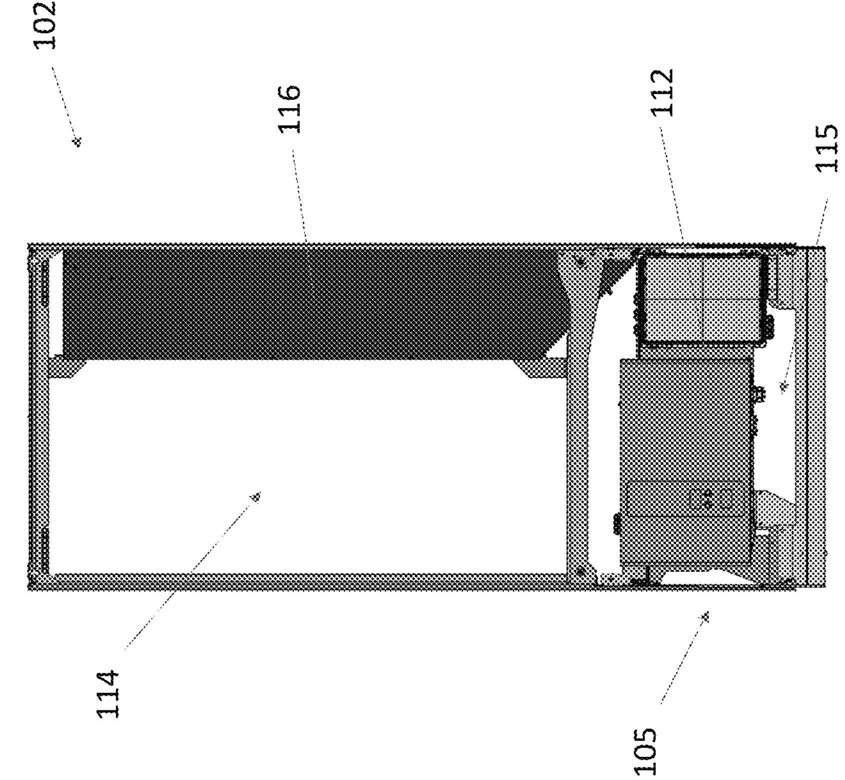
FIG. 6 is a front view of the mounting structure of FIG. 5 with the side assemblies also removed.

FIG. 6 and FIG. 7 illustrates the mounting structure 102 with the side assemblies 104 removed. The recessed compartment 116 may be any size and/or shape. In exemplary embodiments, without limitation, the recessed compartment 116 may be sized such that external EV charging equipment 110 is fully recessed within the compartment 116 when properly stowed, though such is not required. The mounting structure 102 may at least partially define an upper cavity 114. The upper cavity 114, in exemplary embodiments without limitation, may be further defined by the side assemblies 104, such as rear surfaces thereof, and the recessed compartment 116. The upper cavity 114 may be located above the lower cavity 115. A series of apertures 118 may extend between the upper cavity 114 and the lower cavity 115 in exemplary embodiments, without limitation. Some or all of the electronic equipment 112 may be located in the upper cavity 114, though such is not required.

The intake area 106B, the upper cavity 114, the lower cavity 115, and/or the exhaust areas 108C and/or 108D may, at least partially, define a central airflow pathway for ambient air. The central airflow pathway may provide a dedicated airflow of ambient air for thermal management of the electronic equipment 112 in exemplary embodiments, without limitation. The central airflow pathway may form an open loop within the assembly 100. The central airflow pathway may be separate from other open loop airflow pathways, such as those provided at the side assemblies 104, such as under various ingress protection ("IP") standards. One or more fan assemblies 107 may be located at the intake area 106B for moving ambient air through the central airflow pathway. Each of the fan assemblies 107 may comprise one or more fans, which may be axial type fans, centrifugal type fans, combinations thereof, or the like.

Figure 9:
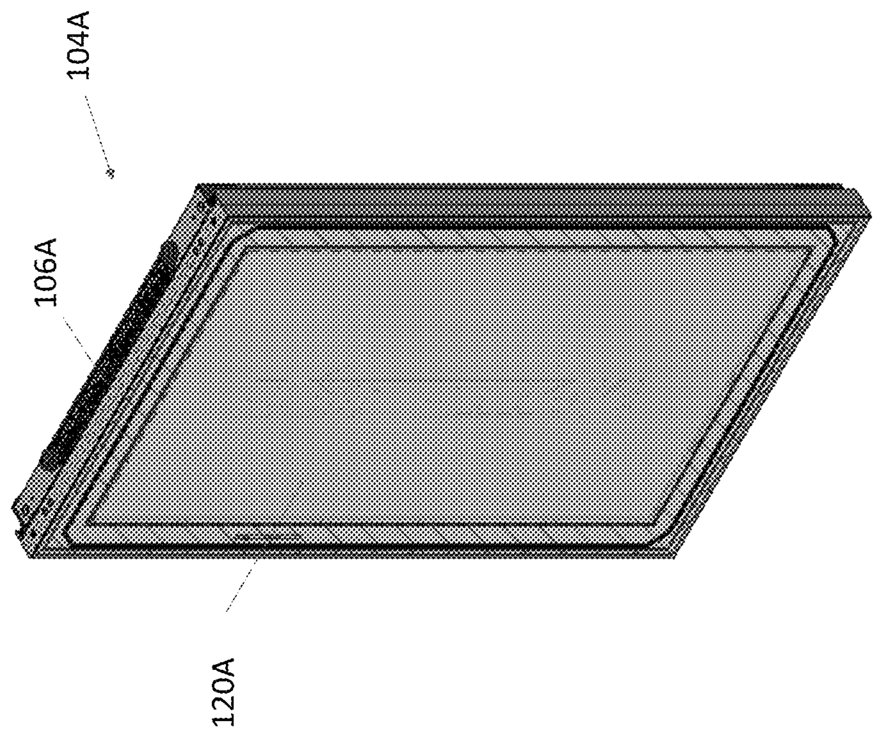
FIG. 9 is a front perspective view of the side assembly of FIG. 8.
Figure 8:
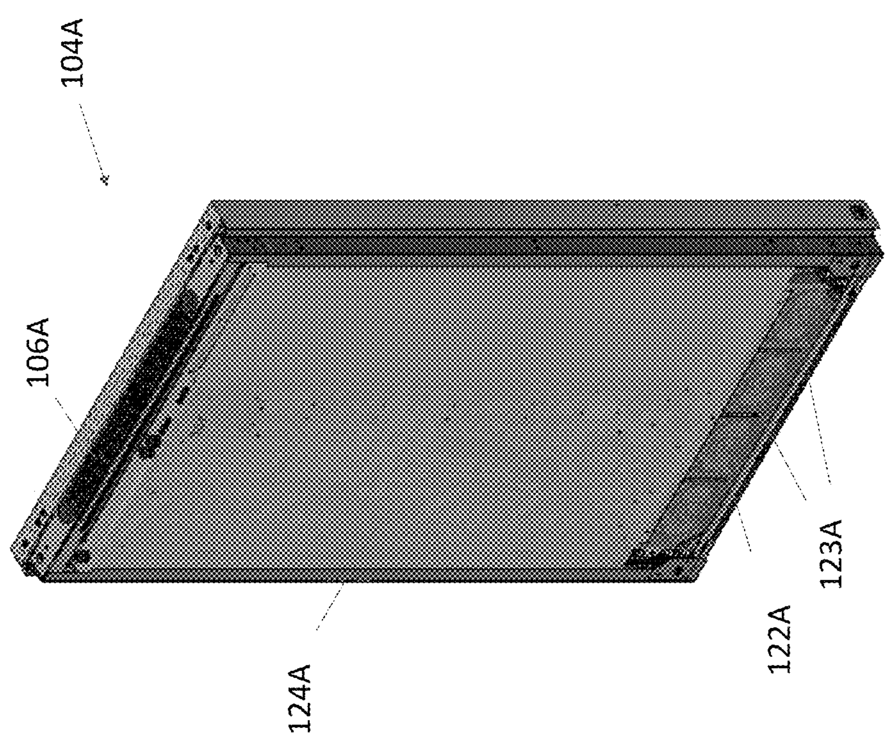
FIG. 8 is a rear perspective view of the side assembly of FIG. 5 illustrated in isolation.

FIG. 8 and FIG. 9 illustrate one of the side assemblies 104A, shown in isolation. Each of the side assemblies 104 may comprise the same, or substantially, the same components in the same, or substantially the same, arrangement, though such is not required. Illustration and/or discussion is sometimes made herein with regard to one of the side assemblies 104A, though similar such components may be provided at other ones of the side assemblies 104B with corresponding item numbers with the addition of a "B" (e.g., 124A to 124B, etc.).

The side assembly 104A may comprise one of the intake areas 106A. The side assembly 104A may comprise a rear cover 124A. A series of side assembly exhausts 122A may be located along a lower edge of the side assembly 104A. The side assembly exhausts 122A may be in fluid communication with the exhaust area 108A. The side assembly 104A may comprise a front cover 120A. Additional details of the side assemblies 104 may be as further provided herein.

FIG. 10A through FIG. 11B illustrate various sectional views of the assembly 100, including the side assemblies 104. Each of the side assemblies 104A, 104B may comprise a cover layer 120A, 120B. The cover layers 120 may each comprise multiple layers which are transparent or translucent (e.g., glass, acrylic) and connected by an optically clear adhesive. However, a single layer may be utilized. One or more polarizers and/or anti-reflective films may be provided at forward or rear surfaces of any of the layers of the covers 120. Each of the side assemblies 104A, 104B may comprise a display layer 126A, 126B. The display layers 126 may each comprise one or more liquid crystal cells, though any type or kind of electronic display may be utilized (e.g., plasma, OLED, projection, cathode ray tube, etc.). Each of the side assemblies 104A, 104B may comprise an illumination device 130A, 130B. The illumination device 130 may comprise one or more light emitting diodes ("LEDs") in exemplary embodiments, without limitation. For example, without limitation, multiple LEDs may be mounted to one or more printed circuit boards arranged to provide direct backlighting to the display layers 126, though any type of lighting and/or arrangement (e.g., edge lighting) may be utilized. A corrugated layer 146A, 146B may extend between each of the illumination devices 130 and a second layer 125A, 125B.

A front channel 128A, 128B may extend between the cover layer 120A, 120B and the display layer 126A, 126B of each of the side assemblies 104A, 104B. A rear channel 136A, 136B may extend between the second layer 124A, 124B and the rear covers 124A, 124B. The front channels 128 may be fluidly connected to the rear channels 136 of the respective side assemblies 104. In exemplary embodiments, without limitation, the front channels 128 and rear channels 136 may define a closed loop airflow pathway for circulating gas within a respective one of the side assemblies 104. The closed loop airflow pathway may surround at least the display layer 126 and the illumination device 125. Alternatively, or additionally, a backlight channel 132A, 132B may extend between the display layers 126A, 126B and the illumination devices 130A, 130B of the side assemblies 104. The backlight channels 132 may be fluidly connected to the front and/or rear channels 128, 136 and form part of the closed loop airflow pathway, though such is not required. A cooling channel 148A, 148B may be provided at each of the side assemblies 104A, 104B between the illumination devices 130A, 130B and the second layers 124A, 124B. The cooling channels 148 may be fluidly connected to one of the intakes 106A, 106C and may be configured to accept ambient air and form part of an open loop airflow pathway at each to the side assemblies 104.

Each of the side assemblies 104A, 104B may comprise one or more fan assemblies 148A, 148B, 123A, 123B. Each of the fan assemblies 148, 123 may comprise one or more fans, which may be axial type fans, centrifugal type fans, combinations thereof, or the like. One or more fan assemblies 148 may be placed within the closed loop airflow pathway of the respective one of the side assemblies 104 for moving circulating gas through the respective closed loop airflow pathway when operated. One or more fan assemblies 123 may be placed within the open loop airflow pathway of the respective one of the side assemblies 104 for moving ambient air through the respective one of the open loop airflow pathways, when operated.

A central airflow pathway may extend within the mounting structure 102, such as between the side assemblies 104 in exemplary embodiments, without limitation. The central airflow pathway may comprise the intake area 106B, the upper cavity 114, the lower cavity 115, and/or the exhaust areas 108C and/or 108D. The exhaust areas 108C, 108D may be common or separate, such as on each side of the mounting structure 102. In this fashion, the central airflow pathway may extend through a middle portion of the display assembly 100. This may provide dedicated cooling to the electronic components 112, in exemplary embodiments. As a great number and/or more power intensive electronic equipment 112 is utilized, increased cooling may be required to optimize component performance and/or longevity. This may also raise the display portions of the side assemblies 104, such as to a more ergonomic viewing height.

The side assemblies 104A, 104B may comprise additional electronic components 142A, 142B, such as for operating various components of the display assembly 100 and/or side assemblies 104A, 104B. The additional electronic components may be located within the rear channels 136. The additional electronic components 142 may comprise, for example without limitation, power modules, transformers, video players, network connectivity equipment (e.g., wireless transmitters/receivers, routers, radios, antennae, combinations thereof, or the like), sensors (e.g., air quality, pressure, temperature, humidity, accelerometer, magnetometers, combinations thereof, or the like), cameras, microphones, location tracking devices, position measurement systems, communications equipment, electronic storage devices, processors, controllers, edge computing devices, combinations thereof, or the like.

The side assemblies 104A, 104B may comprise heat exchangers 134A, 134B. The heat exchangers 134 may comprise multiple layers, such as but not limited to, for accommodating ambient air as part of the open loop airflow pathways and circulating gas as part of the closed loop airflow pathways in an alternating, cross-flow arrangement. However, any type or kind of heat exchangers 134 may be utilized. The open loop portions of the heat exchangers 134 may be in fluid communication with the intakes area 106 and exhaust areas 108, and the closed loop portions of the heat exchangers 134 may be in fluid communication with the front, rear, and/or backlight channels 128, 132, and/or 136. The open loop portions of the heat exchangers 134 may be fluidly connected with the cooling channels 148 or separate therefrom.

The closed loop airflow pathways of the various side assemblies 104 may be separated from one another and/or open loop airflow pathways of the assembly 100, such as by partitions, dividers, walls, panels, gaskets, heat exchangers, seals, combinations thereof, or the like. A complete (e.g., gas impermeable) separation or seal is not necessarily required. In exemplary embodiments, the separation may be sufficient to prevent solid and/or liquid particulate from passing therethrough and/or solid and/or liquid particulate above a given size from passing therethrough. For example, without limitation, such separation may be sufficient to meet certain ingress protection code (IPC) standards, such as but not limited to, IP65, IP66, IP67, or the like.

While EV charging equipment 110 is discussed in some places, any type or kind of equipment 112 may be provided at the display assembly 100, such as but not limited to, within the lower portion 105. Such equipment 112 may comprise, for example without limitation, power transformers, traffic control devices, parking meters, street lighting equipment, and/or other civil or government and/or privately owned equipment, combinations thereof, or the like. Alternatively, or additionally, the mounting structure 102 may be modified to accommodate such equipment 112 and/or other structures, including but not limited to, walls or other surfaces. The side assemblies 104 may be utilized independent of the mounting structure 102, such as for direct mounting to walls, buildings, or other structures.

Figures 10A, 10B:
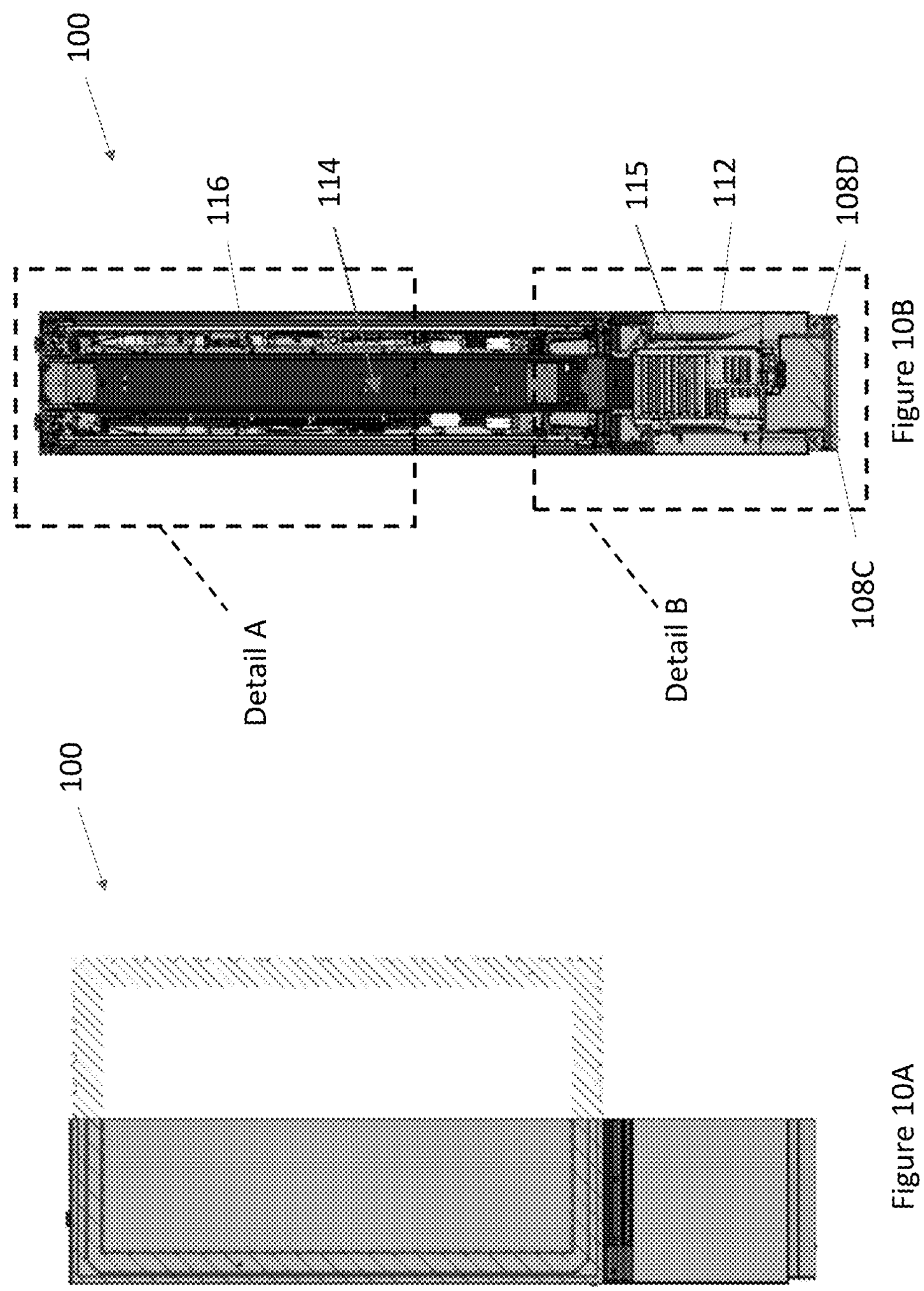
FIG. 10A is a front sectional view of the display assembly of FIG. 1 taken along section line B-B of FIG. 1.
FIG. 10B is a side sectional view of the side assembly of FIG. 10A also indicating detail A and detail B.
Figure 10C:
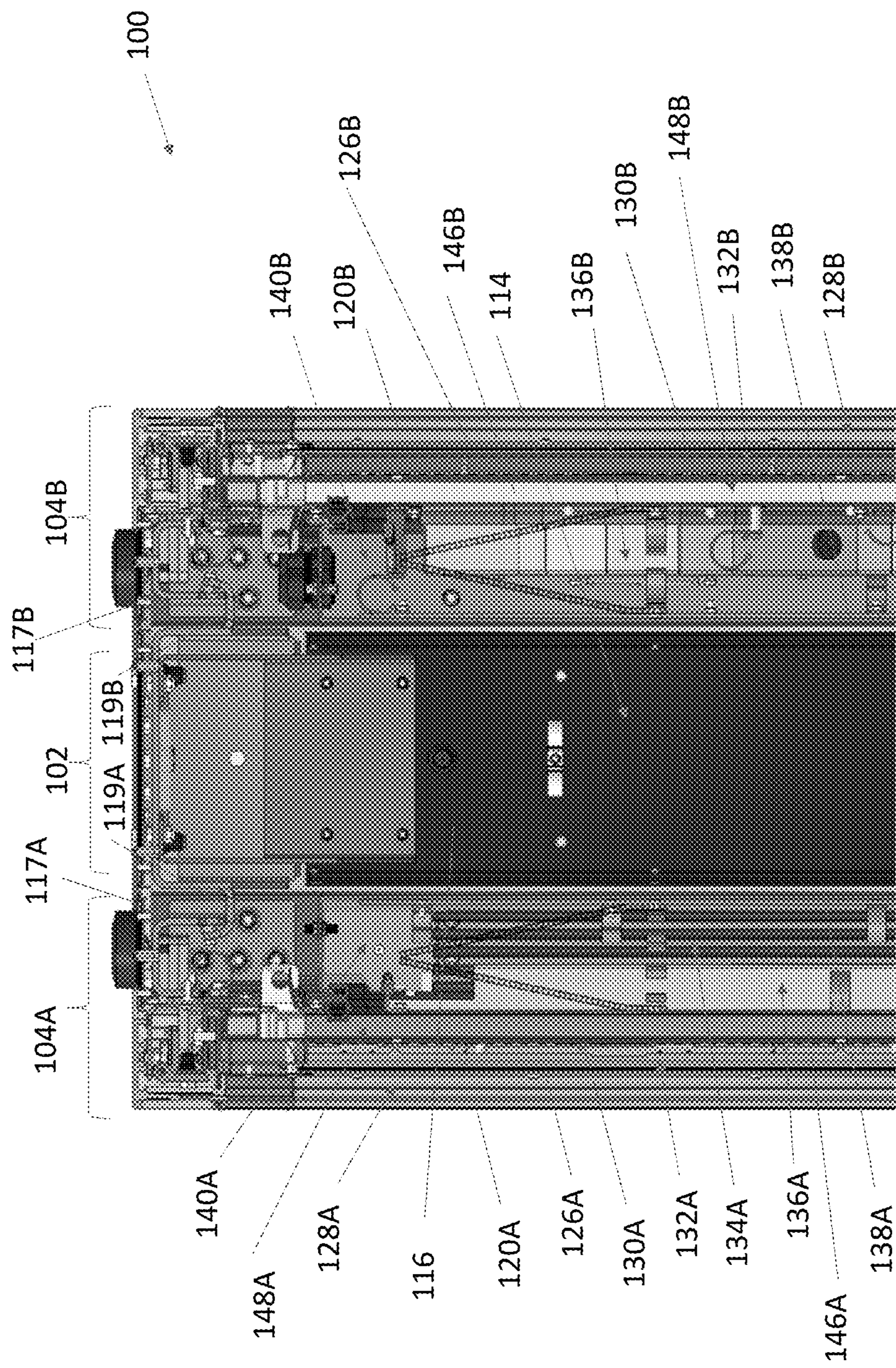
FIG. 10C is a detailed side sectional view of detail A of FIG. 10B.
Figure 10D:
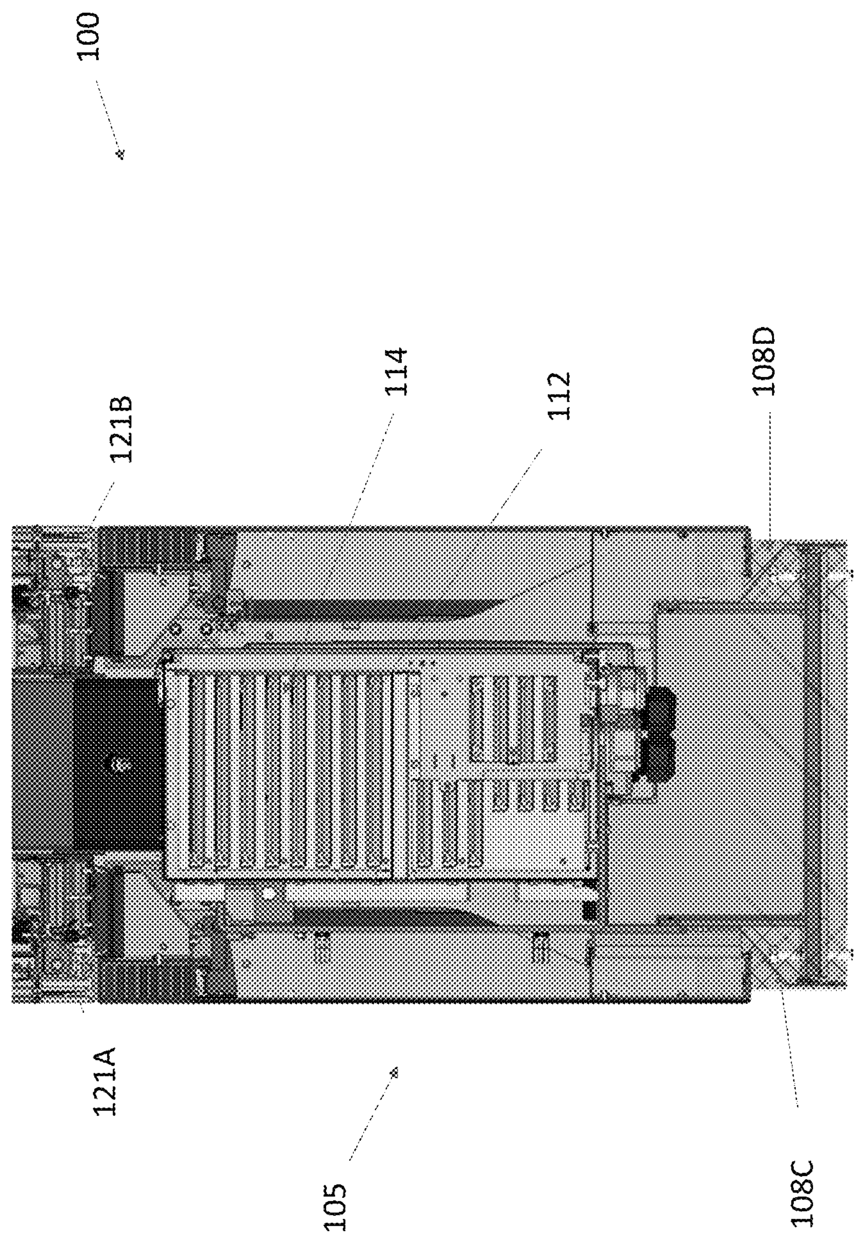
FIG. 10D is a detailed side sectional view of detail B of FIG. 10B.
Figure 10E:
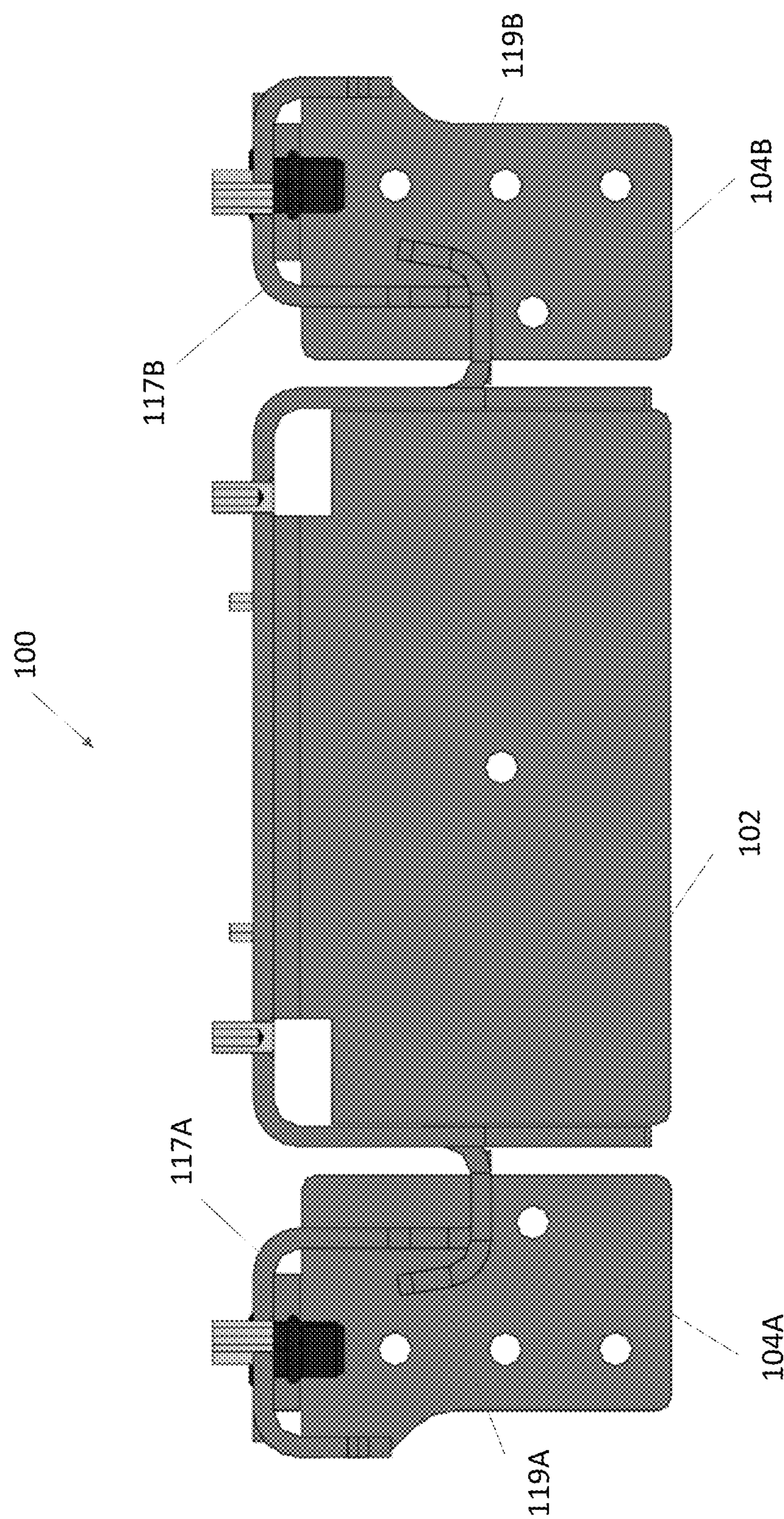
FIG. 10E is a detailed side view of FIG. 10C with certain components shown in isolation.
Figure 11A:
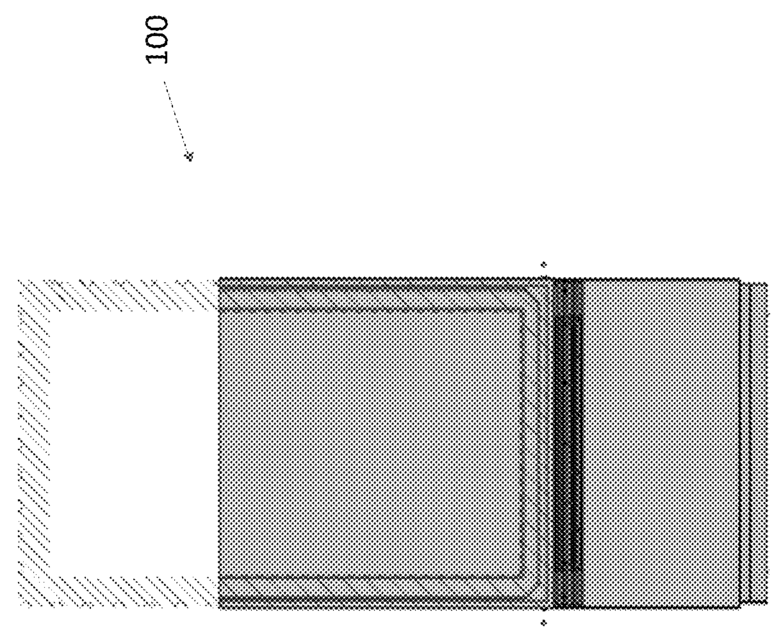
FIG. 11A is a front sectional view of the display assembly of FIG. 1 taken along section line A-A of FIG. 1.
Figure 11B:
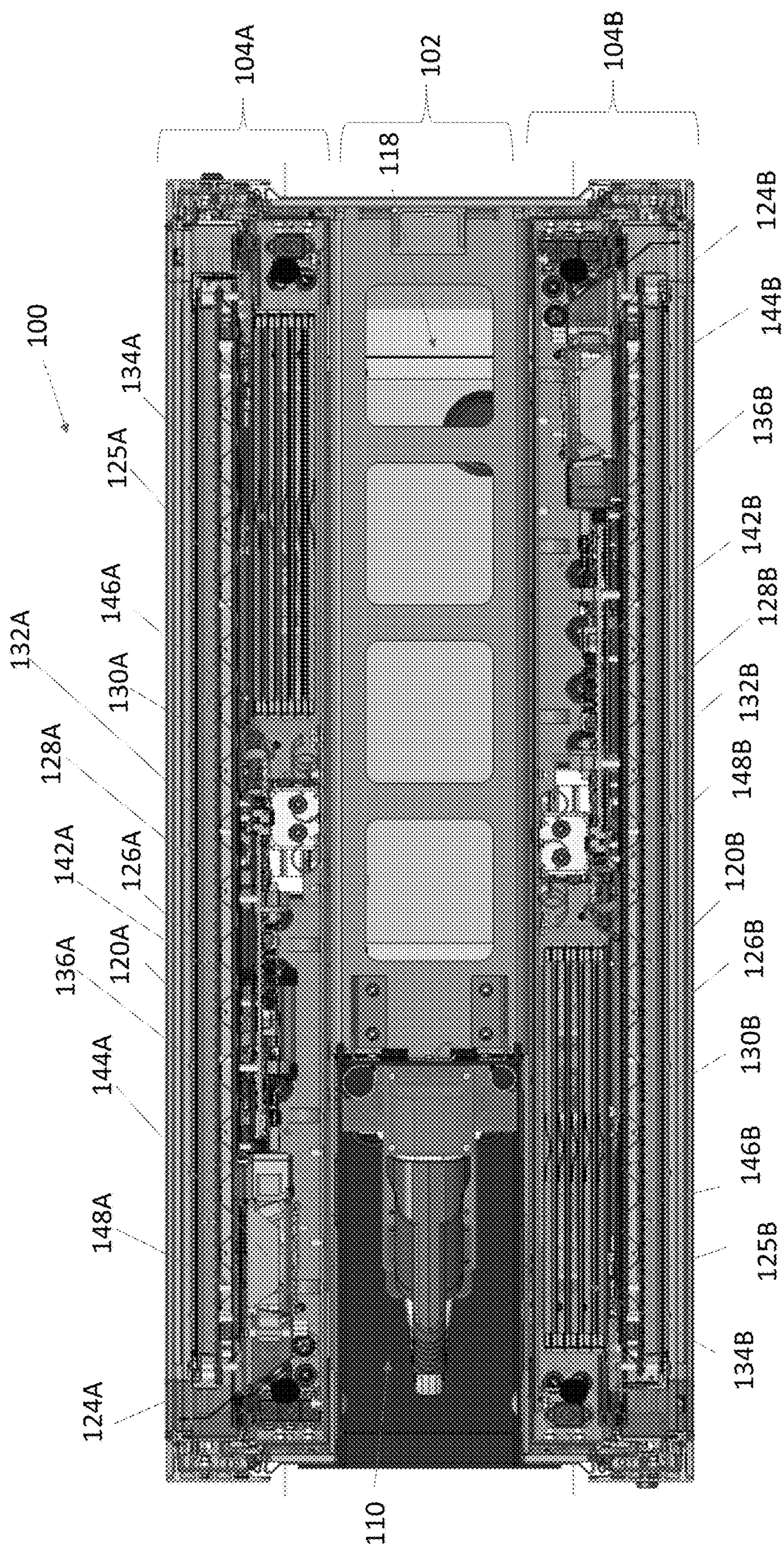
FIG. 11B is a top sectional view taken along section line A-A of FIG. 1.

As illustrated with particular regard to at least FIG. 10E, the side assemblies 104 may comprise one or more mounting devices 117. The mounting devices 117 may comprise holes, pins, hooks, bars, protrusions, combinations thereof, or the like. The mounting devices 117A, 117B of the side assemblies 104A, 104B may be configured to mate with one or more mounting devices 119A, 119B of the mounting structure 102. The mounting devices 119 of the mounting structure 102 may comprise holes, pins, hooks, bars, protrusions, combinations thereof, or the like. The mounting devices 117 and/or 119 may be configured to permit hanging or other mounting of the side assemblies 104 at the mounting structure 102 and/or another surface. Securing devices 121A, 121B may be provided at lower portions of the side assemblies 104A, 104B and/or mounting structure 102 for securing the side assemblies 104 to the mounting structure 102 or other surface, such as when the side assemblies 104 are in a closed position. The securing devices 121 may comprise one or more pins, locks, tabs, latches, fasteners, tie downs, combinations thereof, or the like. In exemplary embodiments, the mounting devices 117, 119 comprise complementary hooks which are configured to selectively mate such that the side assemblies 104 may be removably and/or movably mounted to the mounting structure 102. This may permit ease of mounting.

Figures 12A, 12B, 12C:
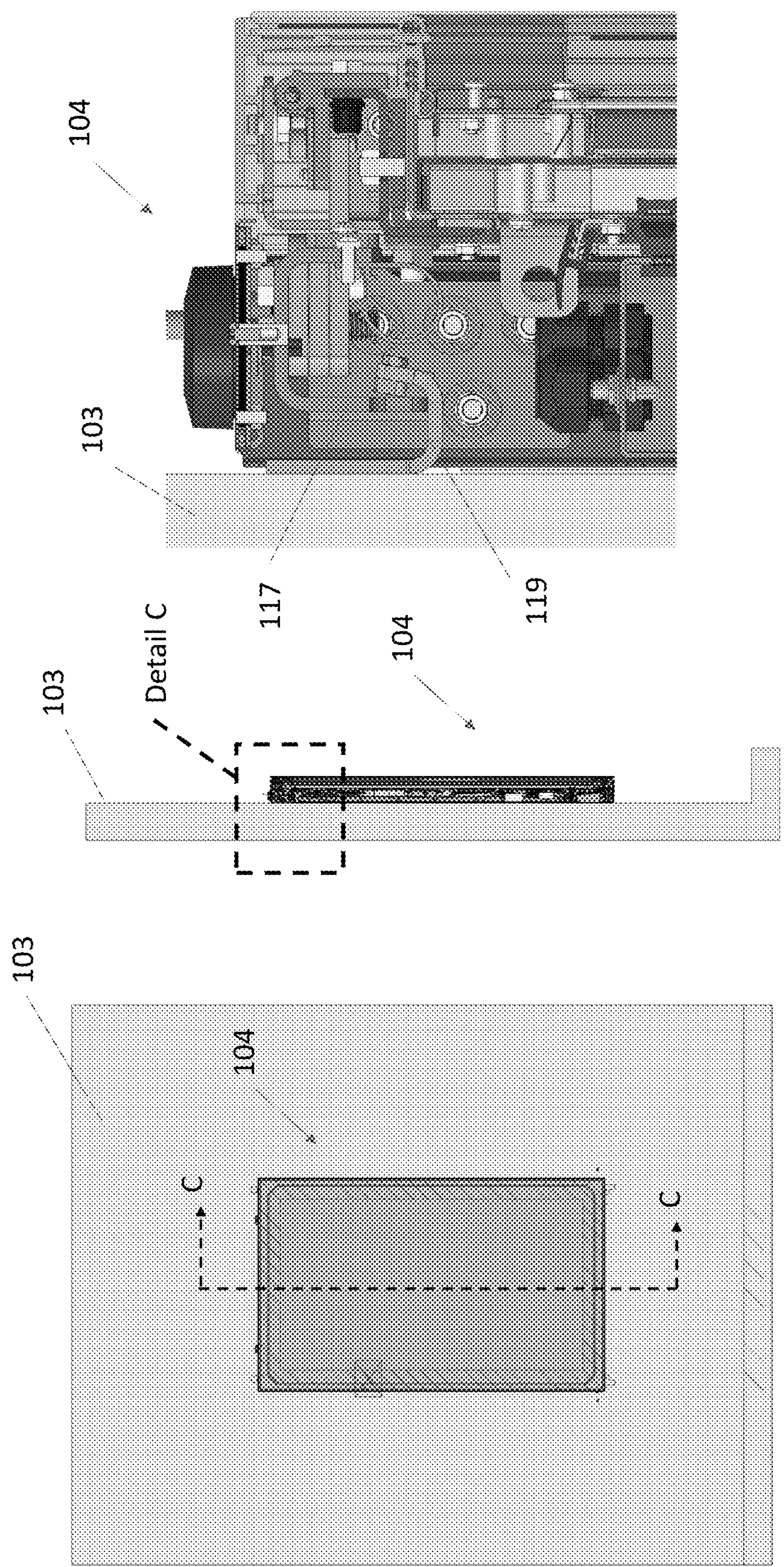
FIG. 12A is a front view of the side assembly separately installed to an exemplary surface in an exemplary fashion.
FIG. 12B is a side sectional view of the installed side assembly of FIG. 12A taken along section line C-C.
FIG. 12C is a detailed side view of detail C of FIG. 12B.
Figure 13B:
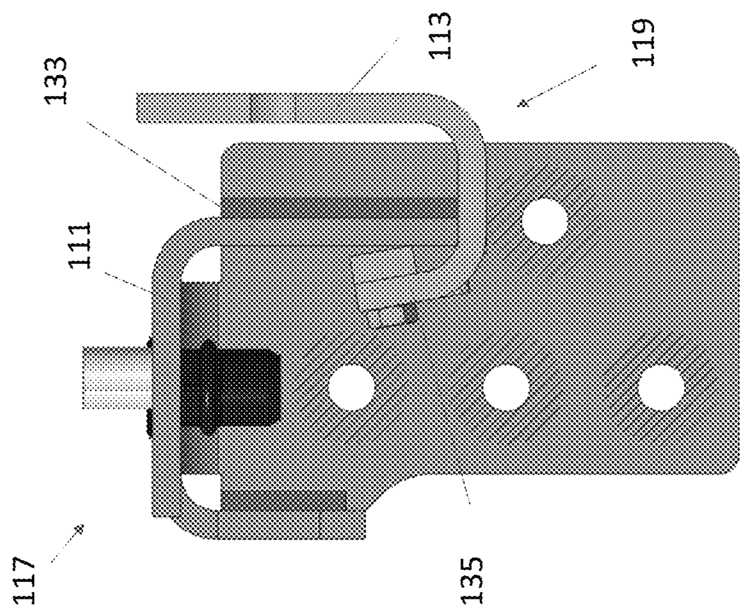
FIG. 13B is a side view of the mounting structure of FIG. 13A.
Figure 13A:
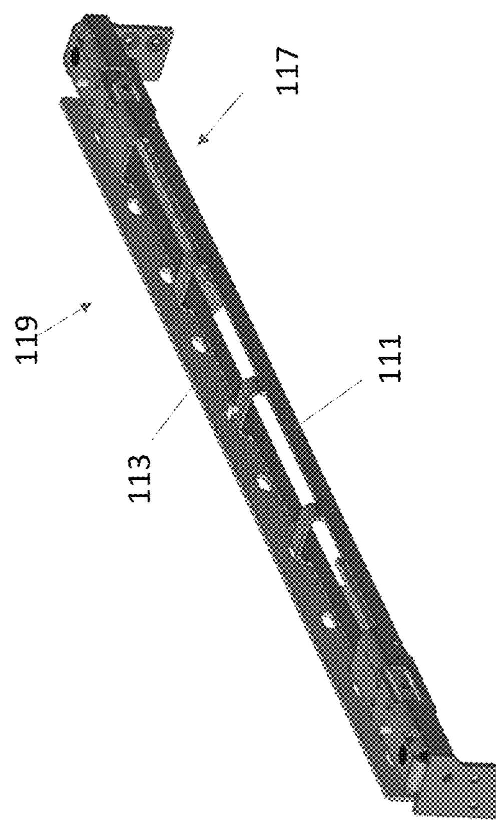
FIG. 13A is a perspective view of an exemplary mounting structure of FIGS. 12A-12C shown in insolation.

FIG. 12A through FIG. 12C illustrate an exemplary embodiment whereby one of the side assemblies 104 is mounted to a surface 103, such as but not limited to a wall by way of the mounting devices 117, 119. The surface 103 may be another object, such as but not limited to the mounting structure 102, in other exemplary embodiments. The surface 103 and/or other object may serve as a mounting point for the side assemblies 104 by way of the mounting device(s) 119 secured to the surface 103 and/or other object and the mounting devices 117 provided at the side assemblies 104. The mounting devices 117, 119 for accomplishing such mounting are further illustrated in at least FIG. 13A through FIG. 13B.

In exemplary embodiments, without limitation, one or more of the mounting devices 119 may be secured to the surface 103 or object. For example, without limitation, fasteners may be passed through portions of the mounting device 119, such as at holes, slots, and/or otherwise solid, fastener permeable material in a laterally extending bracketing portion 113. Alternatively, or additionally, adhesive, welding, or other bonding techniques may be utilized to secure the mounting device 119 to the surface 103 or object. The mounting device 119 may comprise one or more hooked portions 135. The hooked portions 135 may be provided at laterally extending portions 113 of the mounting device 119 in exemplary embodiments. The hooked portions 135 may be provided at either end of the laterally extending portion 113 and/or spaced apart along the same. Preferably, the laterally extending portions 113 are sized to substantially match (e.g., within about 80%-120%) of the lateral width of the cover layer 120 for the side assembly 104. In other exemplary embodiments, each of the hooked portions 135 may form part of a separate mounting device 119. In yet other exemplary embodiments, multiple mounting devices 119, each with one or more hooked portions 135 are utilized with each side assembly 104.

One or more of the mounting devices 117 may be provided at the side assemblies 104. The mounting devices 117, 119 may be complementary, such as to permit removable mounting of the side assembly 104 to the surface 103. The mounting device(s) 117 may comprise one or more hooked portions 133. Preferably, the hooked portions 133 of the mounting devices 117 associated with the side assemblies 104 face and/or are open in a primarily downward direction while the hooked portions 135 of the mounting devices 119 associated with the surface 103 face and/or are open in a primarily upward facing direction. In this fashion, the hooked portions 133 of the mounting devices 117 associated with the side assemblies 104 may be raised above the hooked portions 135 of the mounting devices 119 associated with, and preferably already mounted to, the surface 103 or other object and slid downward to connect, mount, and secure the side assembly 104 to the surface 103 or another object.

The side assemblies 104, in this fashion, may be capable of rotational movement away from the surface 103 or other object, such as to permit access to a rear portion thereof. Alternatively, or additionally, the side assemblies 104 may be removed by upward movement of the side assemblies 104, such as to disengage the mounting devices 117, 119 from one another. Preferably, eye hooks may be provided (permanently or removably, such as by way of threaded apertures) at upper portions of the side assemblies to permit upward movement by attached crane or another device. The side assemblies 104 may be moved laterally outward to clear the mounting devices 117, 119 from each other, then lowered or otherwise moved to another location as desired.

The hooked portions 133 of the mounting devices 117 associated with the side assemblies 104 may be provided at laterally extending portions 111. The hooked portions 133 may be provided at either end of the laterally extending portion 111 and/or spaced apart along the same. Preferably, the laterally extending portions 111 are sized to substantially match (e.g., within about 80%-120%) of the lateral width of the cover layer 120 for the side assembly 104. The mounting devices 117 of the side assemblies 104 may be removably or permanently attached to the side assemblies 104 and/or integrally formed therewith.

One or both of the laterally extending portions 111, 113 may comprise apertures, such as for reduced weight, airflow, and/or accepting fasteners for securing the mounting devices 111, 113 to the surface 103 and/or other portion of the side assembly 104.

Figure 14C:
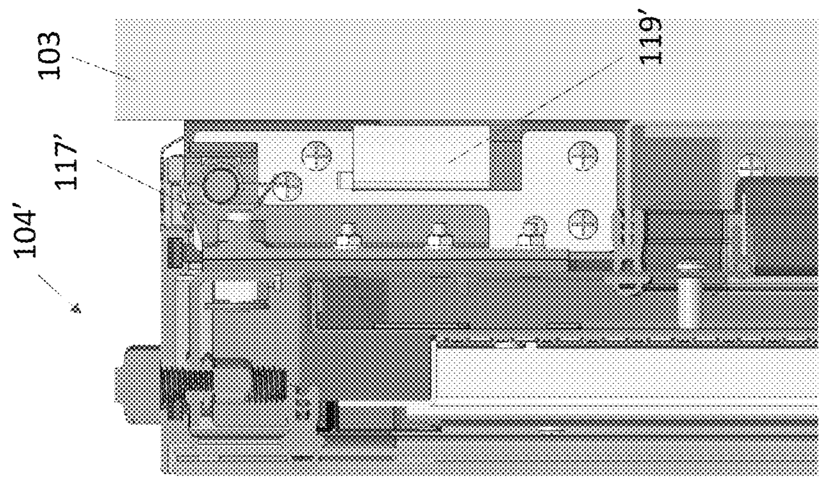
FIG. 14C is a detailed side view of detail D of FIG. 14B.
Figure 14B:
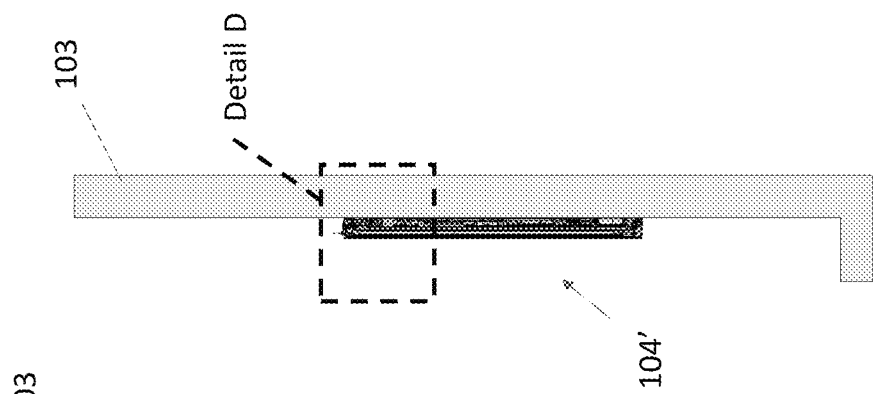
FIG. 14B is a side sectional view of the installed side assembly of FIG. 14A taken along section line D-D.
Figure 14A:
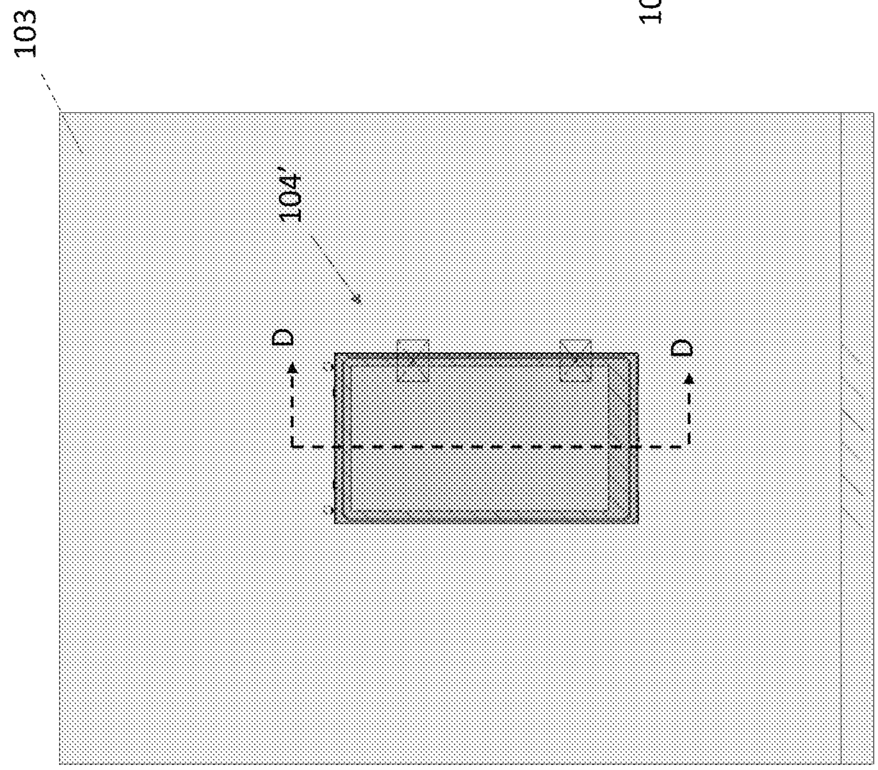
FIG. 14A is a front view of another exemplary embodiment of the side assembly separately installed to the exemplary surface in another exemplary fashion.
Figures 15A, 15B:
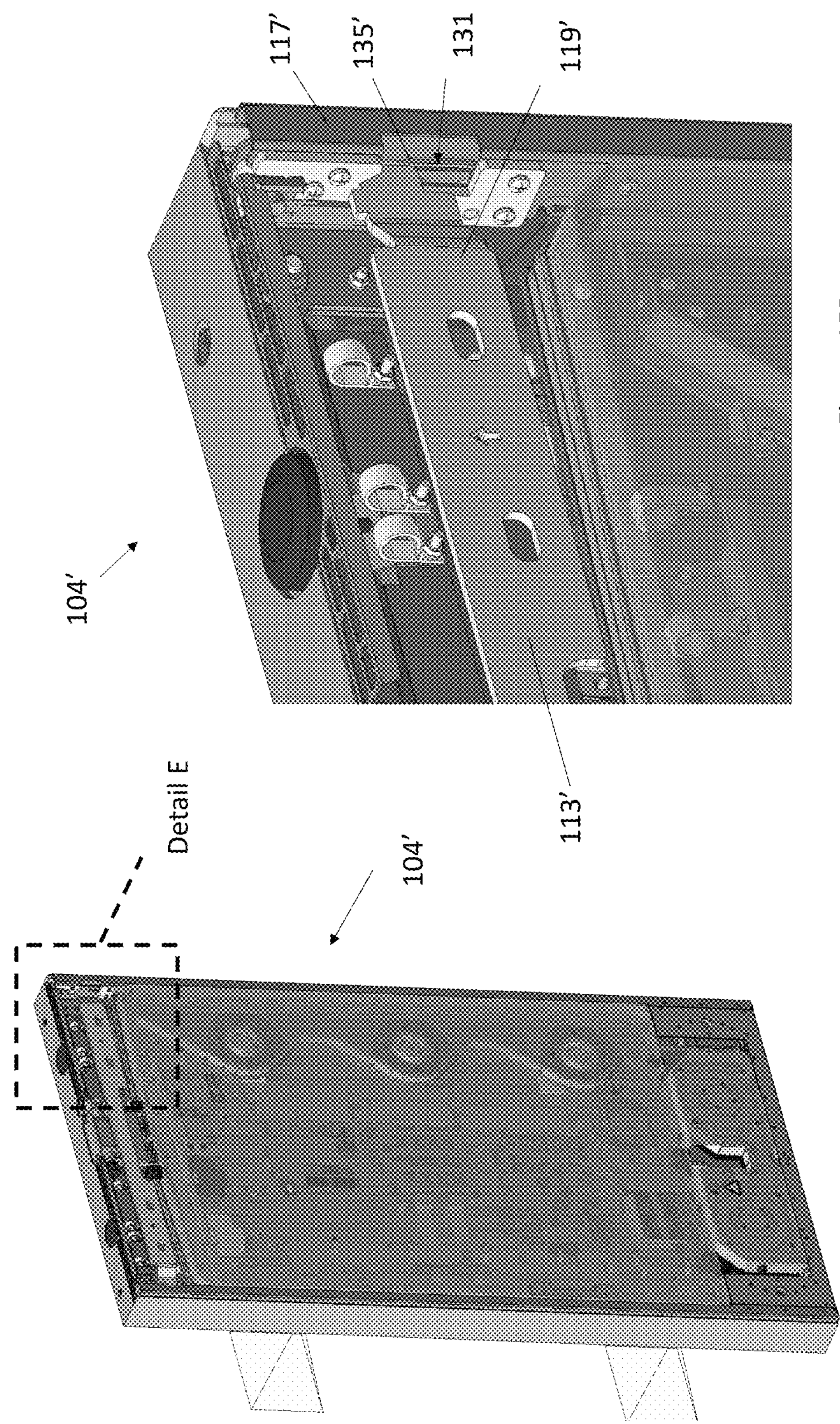
FIG. 15A is a perspective view of an exemplary mounting structure of FIGS. 14A-14C shown in insolation.
FIG. 15B is a detailed perspective view of the mounting structure of detail E of FIG. 15A.
Figure 15D:
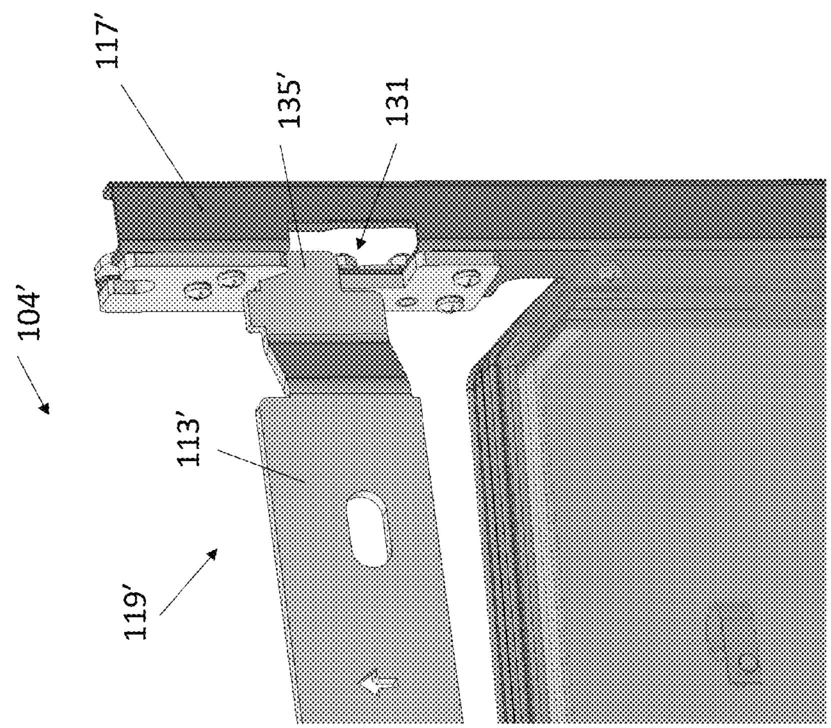
FIG. 15D is a detailed perspective view of the mounting structure of FIGS. 15A-15B with certain components not illustrated so that other features may be better seen.
Figure 15C:
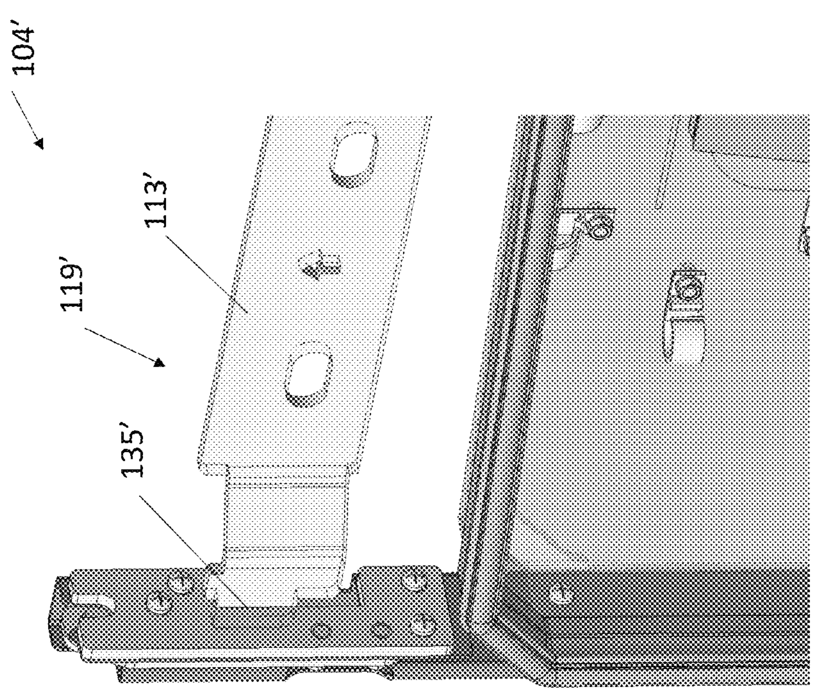
FIG. 15C is a detailed perspective view of the mounting structure of FIGS. 15A-15B with certain components not illustrated so that other features may be better seen.
Figure 16A:
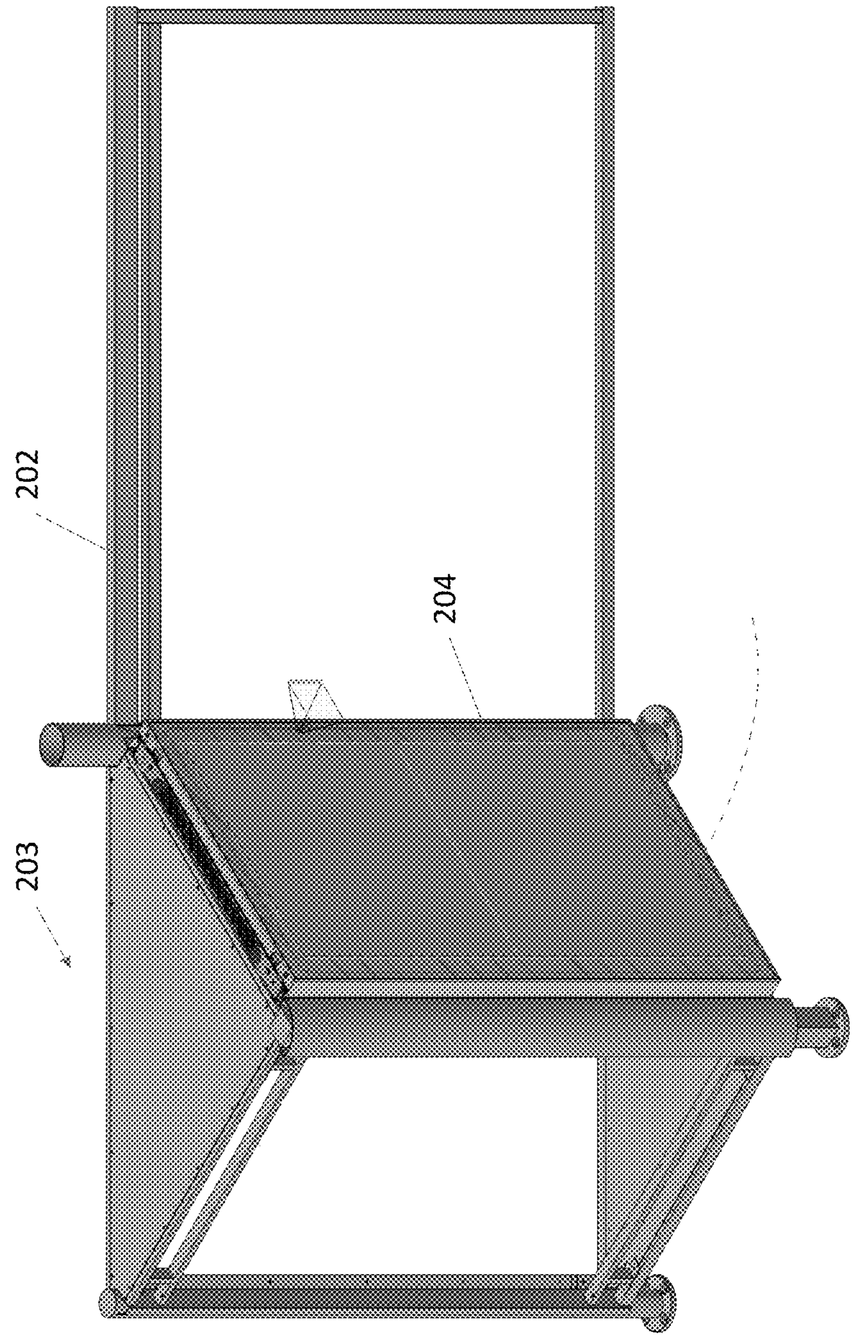
FIG. 16A is a perspective view of an exemplary mounted display.
Figure 16C:
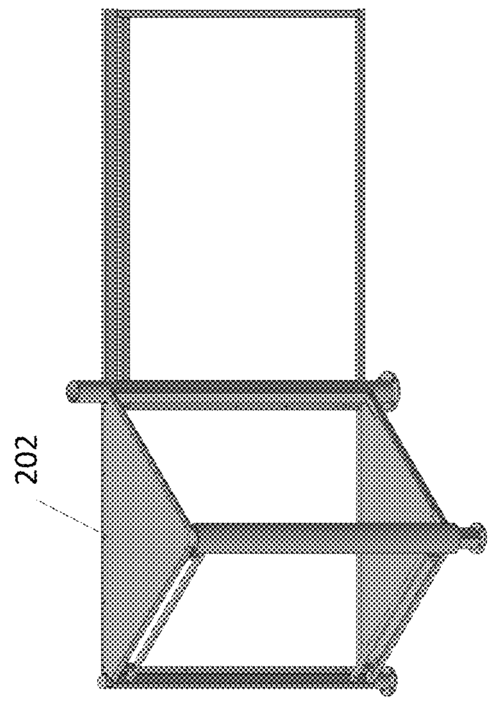
FIG. 16C is the perspective view of FIG. 16B with the mounting structure further retrofitted.
Figure 16B:
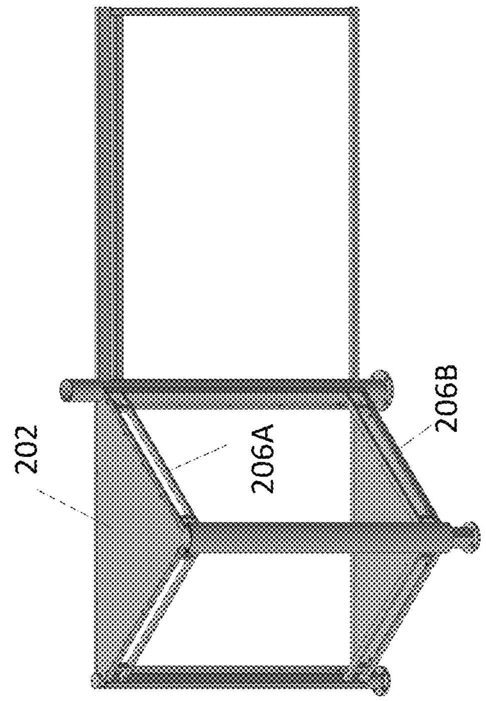
FIG. 16B is a perspective view of an exemplary mounting structure of FIG. 16A partially retrofitting to accommodate an exemplary display assembly.
Figure 16E:
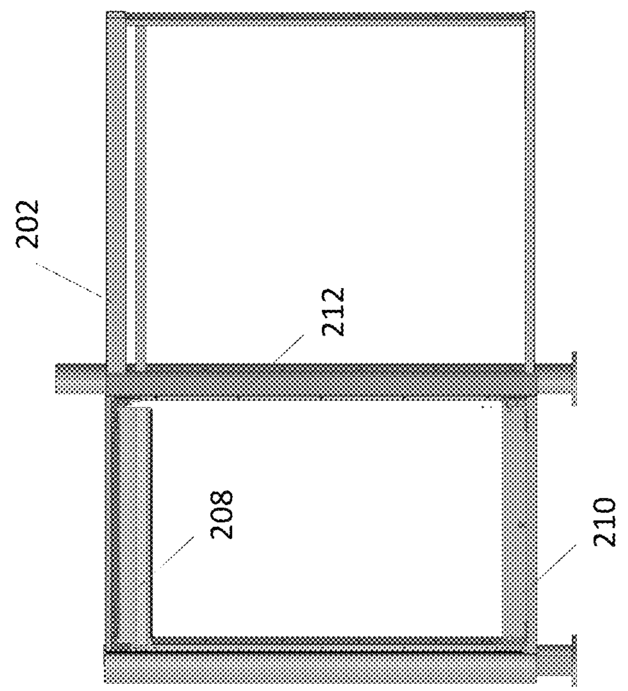
FIG. 16E is the perspective view of FIG. 16D with the mounting structure further retrofitted.
Figure 16D:
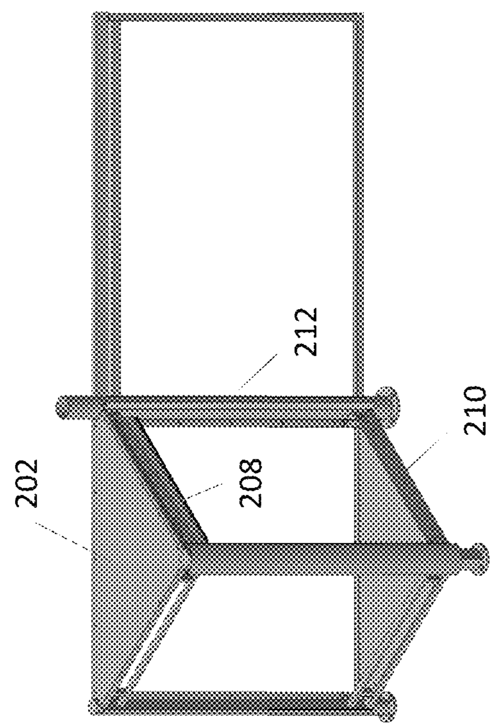
FIG. 16D is the perspective view of FIG. 16C with the mounting structure further retrofitted.
Figure 16F:
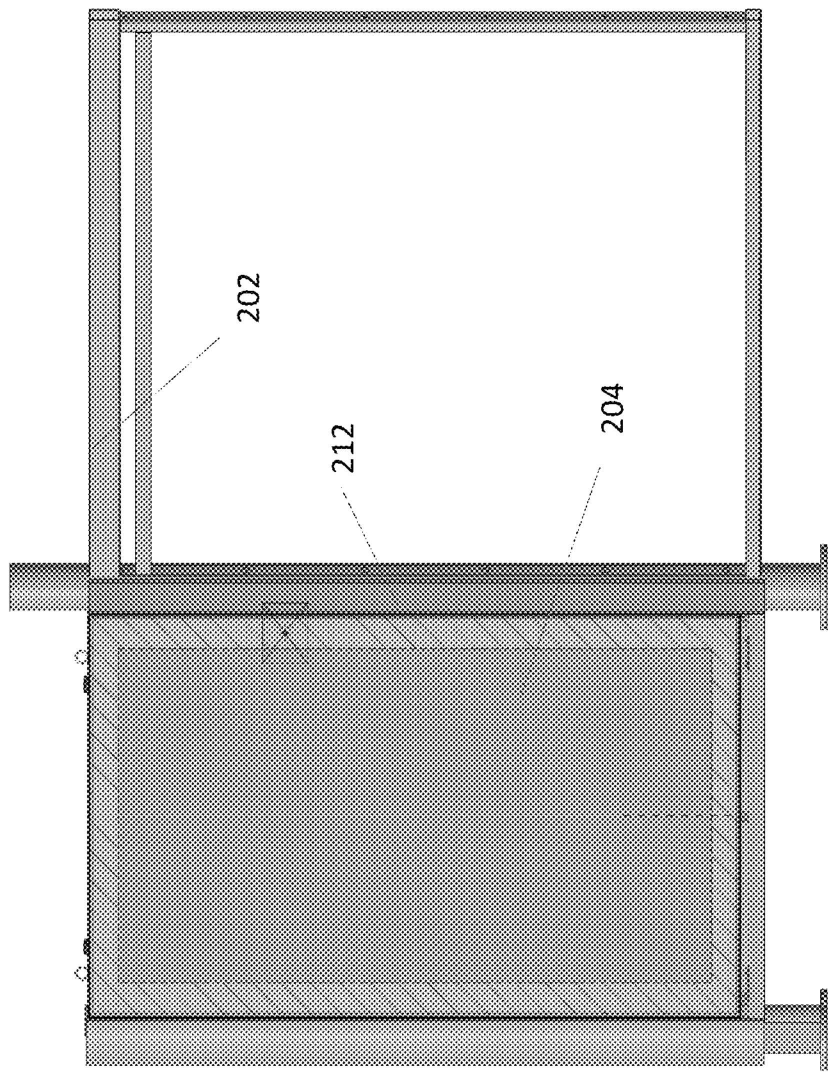
FIG. 16F is a side view of the mounted display of FIG. 16E.
Figure 17B:
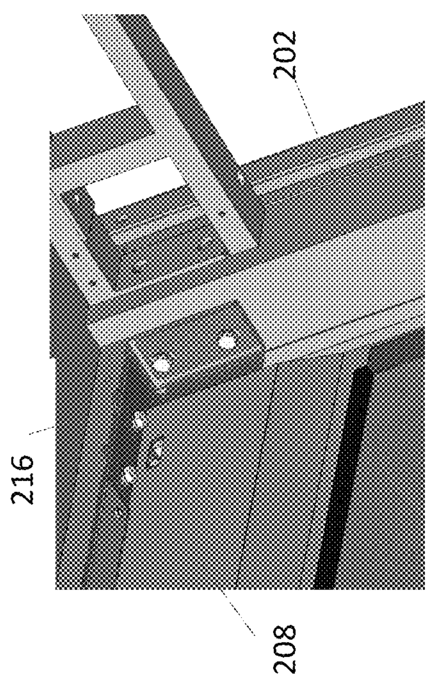
FIG. 17B is a detailed perspective view of the mounted display of FIGS. 16A and 16F.
Figure 17C:
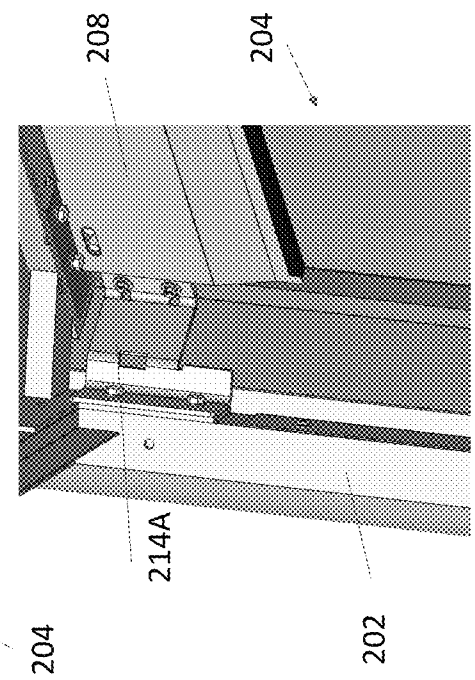
FIG. 17C is another detailed perspective view of the mounted display of FIGS. 16A and 16F.
Figure 17A:
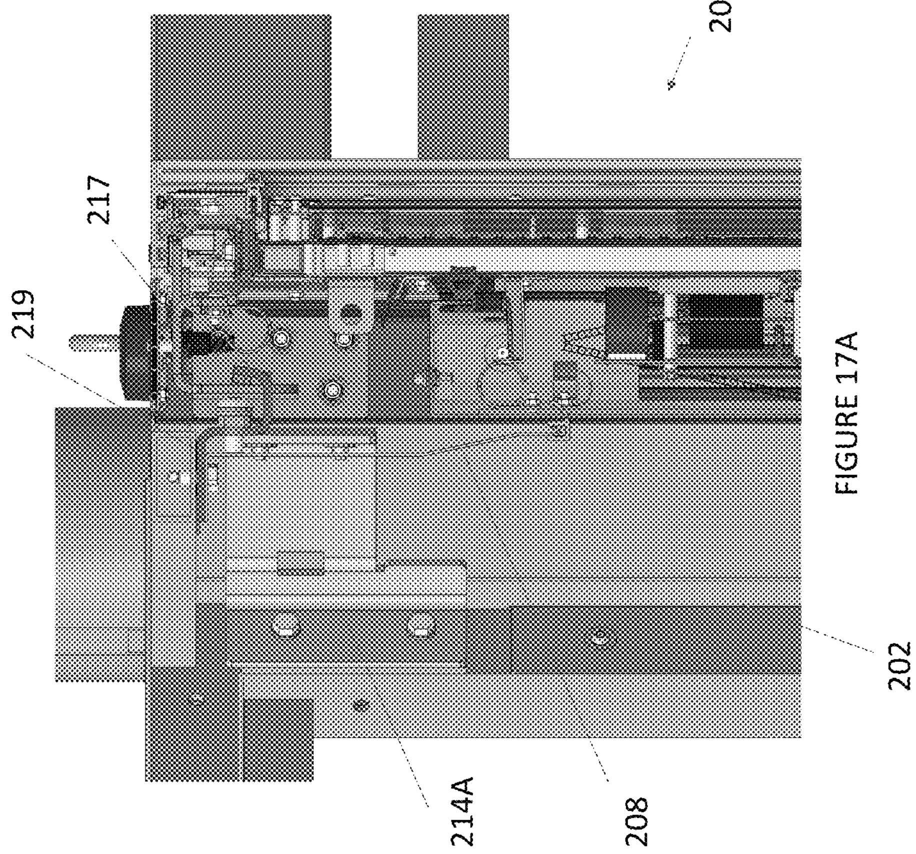
FIG. 17A is a detailed side sectional view of the mounted display of FIGS. 16A and 16F.

FIG. 14A through FIG. 14C illustrate another exemplary embodiment whereby other exemplary mounting devices 117', 119' are used to mount other exemplary side assemblies 104' to the same or other surfaces 103 or other object(s). Same or similar components may be numbered similarly but with the addition of a prime (') (e.g., 117 to 117'). These mounting devices 117', 119' may be, for example without limitation, preferably used with relatively smaller size side assemblies 104' with relatively smaller size displays. These side assemblies 104' may be relatively lighter and thus reduced size mounting devices 117', 119' may be utilized in some embodiments.

In exemplary embodiments, without limitation, the mounting devices 117' associated with the side assemblies 104' may comprise one or more apertures 131, which may be formed as slots. The apertures 131 may be configured to accept hooked portions 135' of the mounting device 119' associated with the surface 103 or other structure. The hooked portions 135' may be provided at either end of a laterally extending portion 113'. The mounting devices 117' associated with the side assembly 104 may be provided at either side of the side assembly 104 to receive the hooked portions 135' in the apertures 131. Two mounting devices 117', in exemplary embodiments, may be provided at each side assembly 104 with a single mounting device 119' associated with the surface 103. The hooked portions 135' may extend laterally and/or depth wise to engage the apertures 131 which may be open in a lateral direction by way of non-limiting example.

Any size, shape, number, and/or kind mounting device 117, 119, 117', 119' with any size, shape, number, and/or kind of components may be provided in any arrangement, preferably in a complementary fashion to permit removable mounting of the side assemblies 104, 104' to surfaces 103. After mounting, the side assemblies 104, 104' may be connected to external power supply and/or communication as need for operation. However, as the side assemblies 104, 104' may be otherwise independent (e.g., self-contained from an airflow perspective), the mounting devices 117, 119, 117', 119' may provide easy of mounting and removal.

The mounting devices 119, 119' may be mounted to one a wall, building, item of street furniture (e.g., a bus shelter, junction box, telephone booth, lamp pole, etc.), or other surface. In this fashion, the side assembly 104 may be so mounted to various locations. In exemplary embodiments, without limitation, the mounting devices 119, 119' may be connected to and/or integrally formed with, laterally support members for such walls, buildings, items of street furniture, or the like. For example, without limitation, the laterally extending portions 113, 113' of the mounting devices 119, 119' may comprise laterally extending support members of a bus shelter.

FIG. 16A through FIG. 16F illustrate an exemplary embodiment whereby a display unit 204 is mounted to an existing bus shelter 202. While a bus shelter 202 is discussed, other structures may be utilized, such as but not limited to, various items of street furniture. The display unit 204 may comprise some or all of the components of the side assemblies 104, 104' and/or display assembly 100. Furthermore, while an approach for retrofitting existing bus shelters 202 is sometimes shown and/or discussed, the components, systems, apparatus, methods, and/or the like may be used for new structures.

Bus shelters 202 and/or other structures sometimes comprise areas 203 for mounting advertising or other signage, such as static poster holders. As illustrated with particular regard to at least FIG. 16B, the areas 203 may comprise upper and/or lower rails 206A, 206B for mounting static poster holders and related components. As illustrated with particular regard to at least FIG. 16C, a retrofitting process may comprise removing such rails 206A, 206B and related components. As illustrated with particular regard to at least FIGS. 16D-16E, the retrofitting process may comprise installing an upper panel 208, a lower panel 210, and/or one or more side panels 212 to the area 203. As illustrated with particular regard to at least FIG. 16F, the display unit 204 may be installed to the area 203.

FIG. 17A through FIG. 17F illustrate the mounted display unit 204 in further detail. As illustrated with particular regard to at least FIGS. 17A and 17C, side brackets 214A may be provided which attach the upper panel 208 to the existing structure 202. A corresponding side bracket 214A may be provided on each side (right and left) of the display unit 204 in exemplary embodiments, without limitation. A mounting device 219 may be attached to the existing structure 202, the side panel 214A, and/or the front panel 208. The mounting device 219 may comprise a preferably upward facing hook portion configured to interact with a mounting device 217 within the display unit 204, which preferably faces downward. Other orientations, including the reverse, may be utilized.

The mounting device 219, 217 may facilitate hanging the display unit 204 from the structure 202. The mounting device 219 may be secured to one or more of side members and/or an upper member of the structure 202. The side brackets 214 may be secured to the side members of the structure 202. The upper panel 208 may be provided, at least in part, to ensure that most or all ambient air is drawn from a space above the structure 202, for example because the air within the area 203 may be relatively warm. The upper panel 208 may be adapted to draw air from various areas, such as with other structures 202. A gasket may be provided at the upper panel 208 to enhance sealing and/or separation of airflows.

As illustrated with particular regard to at least FIGS. 17D-17F, side brackets 214B may be provided at a lower portion of the structure 202, such as to secure the lower panel 210. The lower panel 210 and/or side brackets 214B may serve as a mounting point for a lower portion of the display unit 204, which may be secured by one or more bolts or other fasteners through the lower panel 210 and/or side brackets 214B.

Any embodiment of the present invention may include any of the features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention.

Certain operations described herein may be performed by one or more electronic devices. Each electronic device may comprise one or more processors, electronic storage devices, executable software instructions, combinations thereof, and the like configured to perform the operations described herein. The electronic devices may be general purpose computers or specialized computing devices. The electronic devices may comprise personal computers, smartphone, tablets, databases, servers, or the like. The electronic connections and transmissions described herein may be accomplished by wired or wireless means. The computerized hardware, software, components, systems, steps, methods, and/or processes described herein may serve to improve the speed of the computerized hardware, software, systems, steps, methods, and/or processes described herein.

What is claimed is:

1. A display assembly comprising:

a mounting structure comprising a central airflow pathway for a first dedicated flow of ambient air;

electronic equipment located along said central airflow pathway; and one or more side assemblies, each attached to said mounting structure and comprising a cover, a display layer located rearward of the cover, an illumination device for illuminating at least the display layer when operated, a side assembly open loop airflow pathway for a second dedicated flow of the ambient air, and additional electronic equipment located at each of the one or more side assemblies for operating at least the respective one of said one or more side assemblies;

wherein said electronic equipment, when operated, provides functionality other than operation of said one or more side assemblies;

wherein said central airflow pathway and said side assembly open loop airflow pathway of each of said one or more side assemblies are fluidly separated from one another;

wherein said electronic equipment is electrical independent of said one or more side assemblies.

2. The display assembly of claim 1 wherein:

each of said one or more side assemblies comprise a side assembly closed loop airflow pathway for a dedicated flow of circulating gas.

3. The display assembly of claim 2 wherein:

said central airflow pathway, said side assembly open loop airflow pathway of each of said one or more side assemblies, and said side assembly closed loop airflow pathway of each of said one or more side assemblies are fluidly separated from one another in accordance with one or more of ingress protection code IP65, IP66, and IP67 ratings.

4. The display assembly of claim 2 wherein:

said side assembly open loop airflow pathway and said side assembly closed airflow pathway of each of said one or more side assemblies is contained entirely within a respective one of the one or more side assemblies.

5. The display assembly of claim 4 wherein:

said central airflow pathway is located entirely outside of the one or more side assemblies.

6. The display assembly of claim 2 wherein:

said side assembly closed loop airflow pathway of each of said one or more side assemblies passes in front of, and behind, said display layer of the respective one of the one or more side assemblies.

7. The display assembly of claim 1 wherein:

said side assembly open loop airflow pathway of each of said one or more side assemblies passes along a rear surface of the illumination device of the respective one of the one or more side assemblies.

8. The display assembly of claim 1 wherein:

said electronic equipment comprises electric vehicle ("EV") charging equipment.

9. The display assembly of claim 1 wherein:

said display layer of each of said one or more side assemblies comprises at least one liquid crystal cell; and said illumination device of each of said one or more side assemblies comprises a light emitting diodes arranged to provide direct backlighting to said display layer of the respective one of the one or more side assemblies.

10. The display assembly of claim 1 wherein:

said cover of each of said one or more side assemblies comprises multiple layers including two layers of a transparent or translucent material, at least one polarizer or anti-reflective film provided on one of the at least two layers, and an optical adhesive interposed between the two layers.

11. The display assembly of claim 1 wherein:

said electronic equipment is electrically isolated from said one or more side assemblies.

12. The display assembly of claim 1 wherein:

each of said one or more side assemblies is moveably mounted to said mounting structure; and said one or more side assemblies comprise at least two of the side assemblies positioned at said mounting structure and facing in opposing directions.

13. The display assembly of claim 1 further comprising:

a first set of one or more fans configured to provide said first dedicated flow of the ambient air through said central airflow pathway when operated, wherein each of said one or more side assemblies comprise an additional set of one or more fans configured to provide said second dedicated flow of the ambient air through the side assembly open loop airflow pathway of the respective one of said one or more side assemblies when operated.

14. A display assembly comprising:

a mounting structure comprising a central airflow pathway for a first flow of ambient air;

electronic equipment located along said central airflow pathway; and one or more side assemblies, each attached to said mounting structure and comprising a cover, a display layer located rearward of the cover, an illumination device for illuminating at least the display layer when operated, a side assembly open loop airflow pathway for a second flow of the ambient air, and a side assembly closed loop airflow pathway for a flow of circulating gas;

wherein said central airflow pathway, said side assembly open loop airflow pathway of each of said one or more side assemblies, and said side assembly closed loop airflow pathway of each of said one or more side assemblies are fluidly separated from one another.

15. The display assembly of claim 14 wherein:

fluid separation is in accordance with one or more of ingress protection code IP65, IP66, and IP67 ratings.

16. The display assembly of claim 14 wherein:

said electronic equipment, when operated, provides functionality other than operation of said one or more side assemblies.

17. A display assembly comprising:

a mounting structure comprising a central airflow pathway for a first flow of ambient air;

electronic equipment located along said central airflow pathway; and one or more side assemblies, each attached to said mounting structure and comprising a cover, a display layer located rearward of the cover, an illumination device for illuminating at least the display layer when operated, a side assembly open loop airflow pathway for a second flow of the ambient air, and a side assembly closed loop airflow pathway for a flow of circulating gas;

wherein said side assembly open loop airflow pathway of each of said one or more side assemblies and said side assembly closed loop airflow pathway of each of said one or more side assemblies are located entirely within the respective one of the one or more side assemblies.

18. The display assembly of claim 17 wherein:

the central airflow pathway is located entirely outside of the one or more side assemblies.

19. A display assembly comprising:

a mounting structure comprising a central airflow pathway for a first dedicated flow of ambient air;

electronic equipment located along said central airflow pathway; and two or more side assemblies, each moveably attached to a respective side of said mounting structure to face in different directions, and each comprising a cover, a display layer located rearward of the cover, an illumination device for illuminating at least the display layer when operated, and a side assembly open airflow pathway for a second dedicated flow of the ambient air;

wherein said electronic equipment, when operated, provides functionality other than operation of said one or more side assemblies;

wherein said central airflow pathway and said side assembly open airflow pathway of each of said one or more side assemblies are fluidly separated from one another.

* * * * *

UNITED STATES PATENT AND TRADEMARK OFFICE
CERTIFICATE OF CORRECTION

PATENT NO. : 12,222,592 B2
APPLICATION NO. : 18/750601
DATED : February 11, 2025
INVENTOR(S) : Dunn et al.

It is certified that error appears in the above-identified patent and that said Letters Patent is hereby corrected as shown below:

On the Title Page

Item [56], References Cited, U.S. Patent Documents, please delete "7,212,403 B2 5/2007 Rockenfell" and insert -- 7,212,403 B2 5/2007 Rockenfeller --.

Item [56], References Cited, Other Publications, please delete "The American Heritage College Dictionary, Third Edition, 1993, excerpt, 3 pages, Houghton Company." and insert -- The American Heritage College Dictionary, Third Edition, 1993, excerpt, 3 pages, Houghton Mifflin Company. --.

Item [56], References Cited, Other Publications, please delete "Civiq Smartscapes LLC. V Manufacturing Resources International, Inc., Petition for Inter Partes., Memorandum Order re "rear surface of the electronic display" term construction, Mar. 5, 2019, 3 pages." and insert -- CIVIQ SMARTSCAPES, LLC V. MANUFACTURING RESOURCES INTERNATIONAL, INC., Memorandum Order re "rear surface of the electronic display" term construction, March 5, 2019, 3 pages. --.

In the Claims

In Column 13, Line 57, Claim 1, please delete "electrical" and insert -- electrically --.

Signed and Sealed this
Fifteenth Day of April, 2025

Coke Morgan Stewart
*Acting Director of the United States Patent and Trademark Office*